(12) United States Patent
Ding et al.

(10) Patent No.: US 10,867,908 B2
(45) Date of Patent: Dec. 15, 2020

(54) SEMICONDUCTOR DEVICE HAVING BUFFER STRUCTURE SURROUNDING THROUGH VIA

(71) Applicant: Samsung Electronics Co., Ltd., Suwon-si (KR)

(72) Inventors: Shaofeng Ding, Suwon-si (KR); So Ra Park, Hwaseong-si (KR); Jeong Hoon Ahn, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 90 days.

(21) Appl. No.: 16/239,726

(22) Filed: Jan. 4, 2019

(65) Prior Publication Data
US 2020/0006199 A1    Jan. 2, 2020

(30) Foreign Application Priority Data

Jun. 27, 2018 (KR) .......................... 10-2018-0074229

(51) Int. Cl.
| | |
|---|---|
| *H01L 23/522* | (2006.01) |
| *H01L 23/48* | (2006.01) |
| *H01L 21/768* | (2006.01) |
| *H01L 23/00* | (2006.01) |

(52) U.S. Cl.
CPC .... *H01L 23/5226* (2013.01); *H01L 21/76831* (2013.01); *H01L 21/76843* (2013.01); *H01L 21/76877* (2013.01); *H01L 23/481* (2013.01); *H01L 24/09* (2013.01)

(58) Field of Classification Search
CPC ... H01L 23/481; H01L 23/5226; H01L 24/09; H01L 23/585
See application file for complete search history.

(56) References Cited

U.S. PATENT DOCUMENTS

| | | |
|---|---|---|
| 8,742,590 B2 | 6/2014 | Beyne |
| 8,786,058 B2 | 7/2014 | Han et al. |
| 9,153,559 B2 | 10/2015 | Lee et al. |
| 9,214,374 B2 | 12/2015 | Lee et al. |
| 9,355,904 B2 | 5/2016 | Ramachandran et al. |
| 9,433,100 B2 | 8/2016 | Woychik et al. |
| 2011/0108988 A1* | 5/2011 | Lim .................. H01L 21/76898 257/751 |

(Continued)

FOREIGN PATENT DOCUMENTS

| | | |
|---|---|---|
| KR | 10-1828063 B1 | 11/2012 |
| KR | 10-2013-0055349 A | 5/2013 |

*Primary Examiner* — Michael Jung
(74) *Attorney, Agent, or Firm* — Harness, Dickey & Pierce, P.L.C.

(57) ABSTRACT

A semiconductor device including a substrate having a first surface and a second surface facing the first surface, the substrate having a via hole, the via hole extending from the first surface of the substrate toward the second surface of the substrate, a through via in the via hole, a semiconductor component on the first surface of the substrate, and an internal buffer structure spaced apart from the via hole and between the via hole and the semiconductor component, the internal buffer structure extending from the first surface of the substrate toward an inside of the substrate, a top end of the internal buffer structure being at a level higher than a top end of the through via may be provided.

20 Claims, 20 Drawing Sheets

(56) References Cited

U.S. PATENT DOCUMENTS

| | | | |
|---|---|---|---|
| 2012/0074584 A1* | 3/2012 | Lee | H01L 21/76898 257/774 |
| 2013/0134548 A1* | 5/2013 | Torii | H01L 21/76898 257/508 |
| 2015/0061147 A1* | 3/2015 | Lin | H01L 21/76898 257/774 |
| 2015/0069579 A1* | 3/2015 | Yu | H01L 23/481 257/621 |
| 2015/0228555 A1 | 8/2015 | Rabie et al. | |
| 2015/0243583 A1 | 8/2015 | Li et al. | |
| 2015/0340314 A1* | 11/2015 | Kim | H01L 23/48 257/770 |
| 2016/0372425 A1 | 12/2016 | Liu et al. | |
| 2017/0372986 A1* | 12/2017 | Birner | H01L 29/4175 |

* cited by examiner

US 10,867,908 B2

SEMICONDUCTOR DEVICE HAVING BUFFER STRUCTURE SURROUNDING THROUGH VIA

CROSS-REFERENCE TO RELATED APPLICATION

This U.S. nonprovisional application claims priority under 35 U.S.C § 119 to Korean Patent Application No. 10-2018-0074229 filed on Jun. 27, 2018 in the Korean Intellectual Property Office, the entire contents of which are hereby incorporated by reference.

BACKGROUND

The present inventive concepts relate to semiconductor devices and/or methods of fabricating the same, and more particularly, to semiconductor devices having a silicon through via and/or methods of fabricating the same.

Trends in today's electronics industries are to fabricate lighter weight, more compact, higher speed, multi-functional, and higher performance products at a reasonable price. A multi-chip stacked package technique or a system-in-package technique is used to meet the trends. A through silicon via (TSV) is adopted in the multi-chip stacked package technique or the system-in-package technique.

In relation to the multi-chip stacked package or the system-in-package, a single semiconductor package may perform functions of a number of unit semiconductor devices. Although the multi-chip stacked package or the system-in-package may be somewhat thicker than a typical single chip package, such package has a planar size (or footprint) comparable to a single chip package, and thus are widely used for high-end, compact, and portable products such as mobile phones, laptop computers, memory cards, or portable camcorders.

SUMMARY

Some example embodiments of the present inventive concepts provide semiconductor devices with increased structural stability and/or methods of fabricating the same.

Some example embodiments of the present inventive concepts provide semiconductor devices with improved integration and a method of fabricating the same.

An object of the present inventive concepts is not limited to the mentioned above, and other objects which have not been mentioned above will be clearly understood to those skilled in the art from the following description.

According to an example embodiment of the present inventive concept, a semiconductor device includes a substrate having a first surface and a second surface facing the first surface, the substrate having a via hole, the via hole extending from the first surface of the substrate toward the second surface of the substrate, a through via in the via hole, a semiconductor component on the first surface of the substrate, and an internal buffer structure spaced apart from the via hole and between the via hole and the semiconductor component, the internal buffer structure extending from the first surface of the substrate toward an inside of the substrate, a top end of the internal buffer structure being at a level higher than a top end of the through via.

According to an example embodiment of the present inventive concept, a semiconductor device includes a substrate, a through via extending into the substrate from a first surface of the substrate, a semiconductor component on the first surface of the substrate, an internal buffer structure surrounding the through via, the internal buffer structure being spaced apart from the through via by a first distance, and an external buffer structure surrounding the through via, the external buffer structure being spaced apart from the through via by a second distance, the second distance being greater than the first distance, each of the first distance and the second distance being less than a distance between the through via and the semiconductor component.

According to an example embodiment of the present inventive concepts, a method of fabricating a semiconductor device includes providing a substrate that includes a connection region and a device region spaced apart from the connection region, forming a semiconductor component on the device region of the substrate, etching the connection region of the substrate to form a via hole that extends into the substrate from a first surface of the substrate, forming a through via that fills the via hole, forming an interlayer dielectric layer that covers the semiconductor component and the through via, and etching the interlayer dielectric layer and the substrate on the connection region to form a buffer structure that extends into the substrate from a top surface of the interlayer dielectric layer. The buffer structure may be an air gap from which a portion of the substrate is removed. The air gap may be spaced apart from the via hole and surrounds the via hole.

DETAILED DESCRIPTION

While the term "same" is used in description of example embodiments, it should be understood that some imprecisions may exist. Thus, when an element is referred to as being the same as another element, it should be understood that the element is the same within a desired range (e.g., ±10%) of the other element.

When the terms "about" or "substantially" are used in this specification in connection with a numerical value, it is intended that the associated numerical value include a tolerance of ±10% around the stated numerical value. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure.

Figure 1:
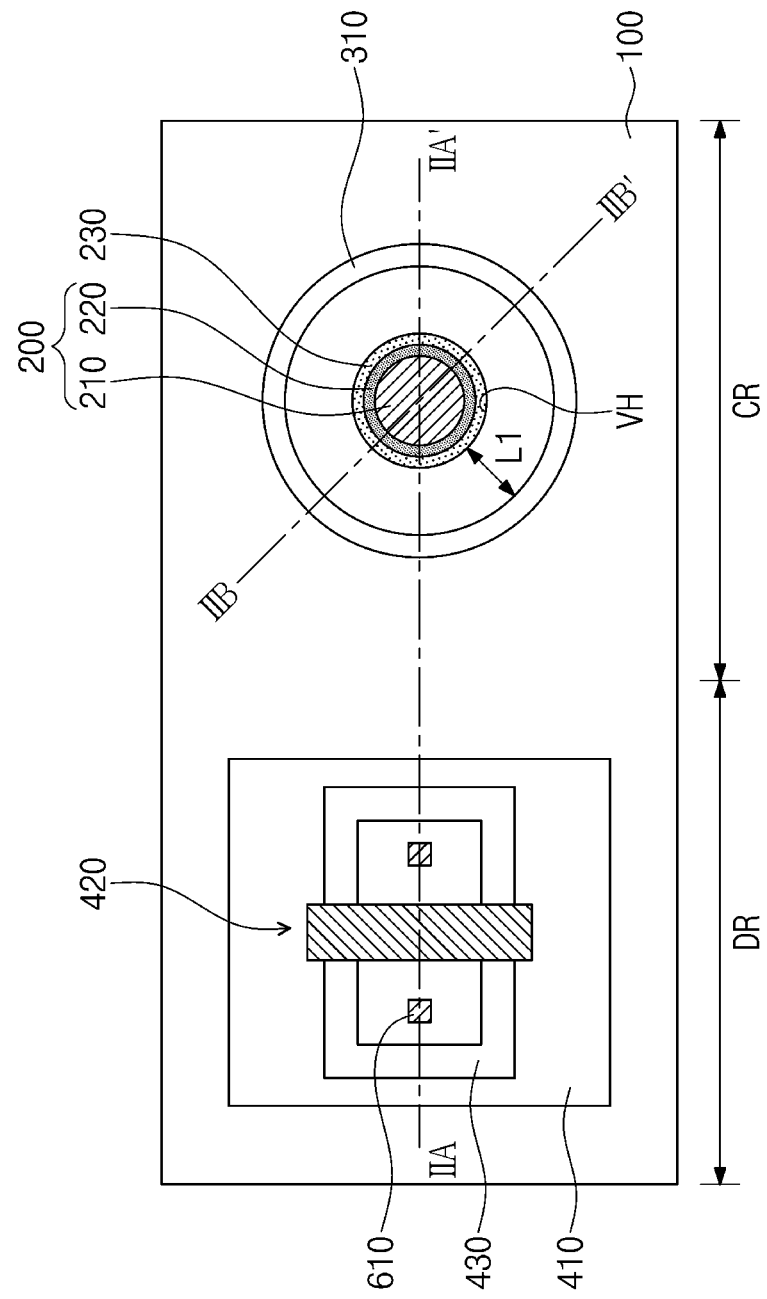
FIG. 1 illustrates a plan view showing a semiconductor device according to an example embodiment of the present inventive concepts.
Figure 2:
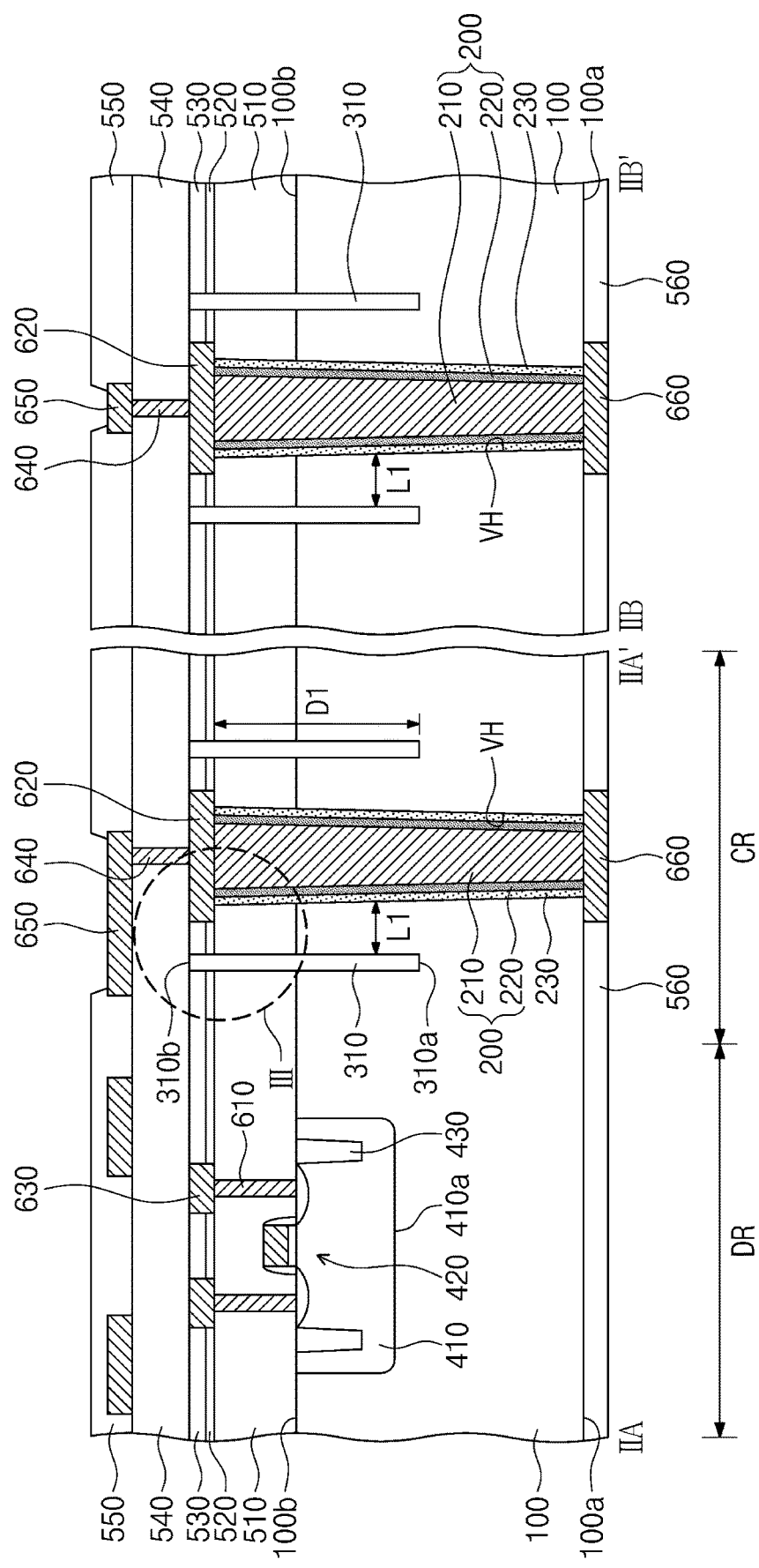
FIG. 2 illustrates a cross-sectional view of a semiconductor device taken along lines IIA-IIA' and IIB-IIB' of FIG. 1 according to an example embodiment of the present inventive concepts.
Figure 3:
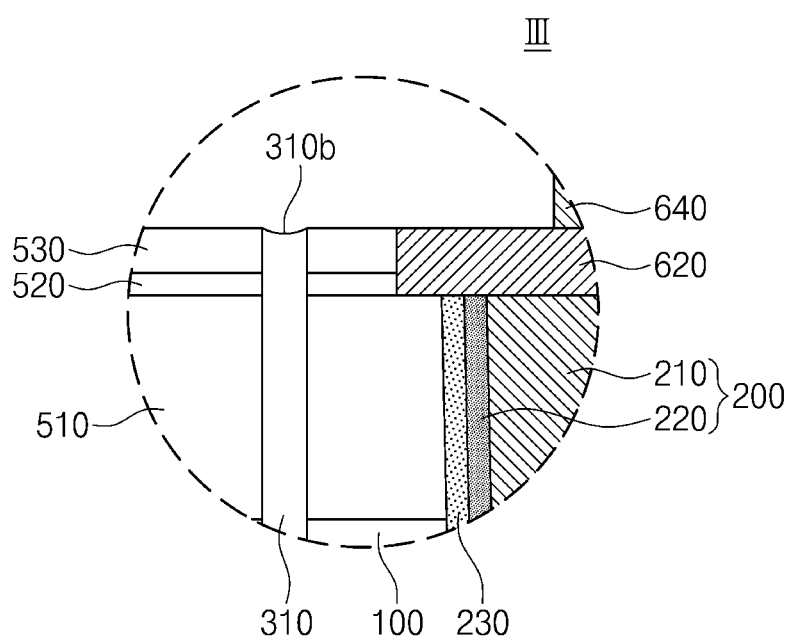
FIG. 3 illustrates an enlarged view for section III of FIG. 2.

A semiconductor device according to the present inventive concepts will now be described below with reference to the accompanying drawings. FIG. 1 illustrates a plan view showing a semiconductor device according to an example embodiment of the present inventive concepts. FIG. 2 illustrates a cross-sectional view of a semiconductor device taken along lines IIA-IIA' and IIB-IIB' of FIG. 1, according to an example embodiment of the present inventive concepts. FIG. 3 illustrates an enlarged view for section III of FIG. 2.

Referring to FIGS. 1 and 2, a substrate 100 may be provided. The substrate 100 may have a first surface 100b and a second surface 100a facing the first surface 100b. The substrate 100 may include a connection region CR and a device region DR spaced apart from the connection region CR. The substrate 100 may be or include a semiconductor substrate. The semiconductor substrate may include, for example, a silicon substrate, a sapphire substrate, or a compound semiconductor substrate. The substrate 100 may be doped with p-type impurities.

The substrate 100 may be provided with a well 410. The well 410 may be provided on the device region DR. The well 410 may be provided on the first surface 100b. The well 410 may extend from the first surface 100b toward the second surface 100a. A semiconductor component 420 may be provided in the well 410. The semiconductor component 420 may be or include a transistor. The semiconductor component 420 may be, for example, an NMOS transistor, a PMOS transistor, or a bipolar transistor. A device isolation layer 430 may be provided in the well 410. When viewed in a plan view, the device isolation layer 430 may surround the semiconductor component 420. FIGS. 1 and 2 show that a single semiconductor component 420 is provided in the well 410, but the present inventive concepts are not limited thereto. A plurality of semiconductor components 420 may be provided in a single well 410.

A first interlayer dielectric layer 510 may be disposed on the first surface 100b of the substrate 100. The first interlayer dielectric layer 510 may cover the semiconductor component 420. The first interlayer dielectric layer 510 may include, for example, silicon oxide (SiOx) or silicon nitride (SiNx).

A via hole VH may be provided in the substrate 100. The via hole VH may be provided on the connection region CR. The via hole VH may penetrate the first interlayer dielectric layer 510 and the substrate 100. The via hole VH may extend toward the second surface 100a of the substrate 100 from the first interlayer dielectric layer 510 on the first surface 100b of the substrate 100.

A through via 200 may be disposed in the via hole VH. The through via 200 may fill the via hole VH. The through via 200 may be exposed on the second surface 100a. The through via 200 may include a barrier layer pattern 220 and a conductive layer pattern 210. The barrier layer pattern 220 may be disposed between the conductive layer pattern 210 and an inner wall of the via hole VH. The barrier layer pattern 220 may include titanium (Ti), titanium nitride (TiN), tantalum (Ta), tantalum nitride (TaN), ruthenium (Ru), cobalt (Co), tungsten nitride (WN), nickel (Ni), nickel boride (NiB), or a combination thereof. The barrier layer pattern 220 may reduce or prevent metal of the conductive layer pattern 210 from diffusing into the substrate 100. The conductive layer pattern 210 may include metal. The metal may include, for example, silver (Ag), gold (Au), aluminum (Al), tungsten (W), or indium (In).

A via dielectric layer pattern 230 may be interposed between the through via 200 and the inner wall of the via hole VH. The via dielectric layer pattern 230 may have a thickness of about 200 nm. The via dielectric layer pattern 230 may include silicon oxide (SiOx), silicon nitride (SiNx), or a combination thereof. For example, the via dielectric layer pattern 230 may be silicon oxide (SiOx). In some example embodiments, a polymer layer may further be provided on the via dielectric layer pattern 230. The polymer layer may include a low-k dielectric material. For example, the polymer layer may include a fluorocarbon (CF) based polymeric material.

An internal buffer structure 310 may be provided in the substrate 100. The internal buffer structure 310 may be an air gap that is formed in the substrate 100, the first interlayer dielectric layer 510, and a second interlayer dielectric layer 530 provided on the first interlayer dielectric layer 510. The internal buffer structure 310 may be spaced apart from the via hole VH. For example, the internal buffer structure 310 may be spaced apart from the via hole VH at a spacing distance of about 1 to 5 μm. When viewed in a plan view, the internal buffer structure 310 may surround the via hole VH. For example, the internal buffer structure 310 may have a circular ring shape when viewed in a plan view, and the through via 200 may be placed inside the internal buffer structure 310. When viewed in a plan view, the internal buffer structure 310 may be a closed loop that is spaced apart at a first length (alternatively, first distance) L1 from the via hole VH. FIG. 1 shows that the internal buffer structure 310 has a circular ring shape in a plan view, but the present inventive concepts are not limited thereto. In some example embodiments, when viewed in a plan view, the internal buffer structure 310 may have an elliptical ring shape, a rectangular ring shape, or a polygonal ring shape. A portion of the substrate 100 may be interposed between the internal buffer structure 310 and the through via 200 that fills the via hole VH. In such cases, because no air gap is provided between the internal buffer structure 310 and the through via 200, the through via 200 may be stably anchored in the via hole VH.

The internal buffer structure 310 may extend from the first surface 100b toward the second surface 100a of the substrate 100. The internal buffer structure 310 may penetrate the first interlayer dielectric layer 510. The internal buffer structure 310 may have a top end 310b at a level higher than a top end of the via hole VH. For example, the internal buffer structure 310 may protrude beyond a top surface of the first interlayer dielectric layer 510. As shown in FIGS. 2 and 3, the internal buffer structure 310 may extend from the substrate 100 toward a top surface of the second interlayer dielectric layer 530. The top end 310b of the internal buffer structure 310 may have a concave shape that is recessed toward a bottom end 310a of the internal buffer structure 310. In some example embodiments, the top end 310b of the internal buffer structure 310 may be flat. The internal buffer structure 310 may penetrate the first interlayer dielectric layer 510 and the second interlayer dielectric layer 530. The top end 310b of the internal buffer structure 310 may be located at a height (or level) that is equal to or higher a threshold height by which electrical characteristics of the semiconductor component 420 can be appropriately protected from being affected by thermal stress associated with the through via 200.

The internal buffer structure 310 may have a depth less than the via hole VH. For example, the bottom end 310a of the internal buffer structure 310 may be located at a level higher than a bottom end of the via hole VH. The internal buffer structure 310 may not be exposed on the second surface 100a of the substrate 100. For example, the internal buffer structure 310 may not fully penetrate the substrate 100. The depth of the internal buffer structure 310 may be greater than that of the semiconductor component 420. For example, the bottom end 310a of the internal buffer structure 310 may be located at a level equal to or lower than a bottom end of the well 410. The internal buffer structure 310 may be a depth that is equal to or greater than a threshold depth by which electrical characteristics of the semiconductor component 420 can be appropriately protected from being affected by thermal stress associated with the through via 200. The depth of the internal buffer structure 310 may fall within a range from about 150 nm to about 500 nm. The depth of the internal buffer structure 310 may be less than that of through via 200. For example, the internal buffer structure 310 may be provided to have a comparable depth to the well 410, thereby eliminating or mitigation deterioration of structural stability that arises when the internal buffer structure 310 is formed deep or wide.

In some example embodiments, the top end 310b of the internal buffer structure 310 may be located at a level higher than top ends of the semiconductor component 420 and the through via 200, and the bottom end 310a of the internal buffer structure 310 may be located at a level lower than the bottom end of the well 410. In such cases, it may be possible to effectively block propagation paths of stress and impact resulting from the through via 200. Thus, the internal buffer structure 310 may protect the semiconductor component 420 from stress and impact.

Referring back to FIGS. 1 and 2, the internal buffer structure 310 may have a uniform width. The bottom end 310a of the internal buffer structure 310 may be perpendicular to a sidewall of the internal buffer structure 310. In some example embodiments, the width of the internal buffer structure 310 may decrease as approaching the second surface 100a of the substrate 100. The width of the internal buffer structure 310 may be less than that of the via hole VH. For example, the width of the internal buffer structure 310 may be within a range of about 1 to about 1000 nm, and the width of the via hole VH may be within a range of about 1 to about 10 μm.

In general, when a semiconductor component is formed adjacent to a through via that is made of metal, electrical characteristics and reliability of the semiconductor component may be affected by thermal stress resulting from the through via. Therefore, a keep-out zone (KOZ) in which the semiconductor component is not arranged, may be provided. In general, the keep-out zone (KOZ) of semiconductor devices having through silicon vias (TSVs) may have a size equal to or greater than about 20 μm from the through silicon via.

In some example embodiments, the internal buffer structure 310 may be provided between the semiconductor component 420 and the through via 200. The well 410 may be spaced apart from the through via 200 with the internal buffer structure 310 therebetween. The internal buffer structure 310 may mitigate or prevent thermal stress from being transmitted from the through via 200 toward the well 410. A semiconductor device may thus reduce the keep-out zone. For example, the keep-out zone may have a size equal to or less than about 0.5 μm from the internal buffer structure 310, and the semiconductor component 420 may be formed at a location about 0.5 to 20 μm distant from the internal buffer structure 310. A provision of the internal buffer structure 310 may reduce a size of the keep-out zone, thereby increasing an integration density of a semiconductor device.

Referring back to FIGS. 1 and 2, a first contact 610 may be disposed in the first interlayer dielectric layer 510. The first contact 610 may penetrate the first interlayer dielectric layer 510 and be connected to a source/drain region of the semiconductor component 420.

The second interlayer dielectric layer 530 may cover the first interlayer dielectric layer 510. As shown in FIG. 3, the internal buffer structure 310 may penetrate the second interlayer dielectric layer 530. The internal buffer structure 310 may extend into the substrate 100 from the top surface of the second interlayer dielectric layer 530. The second interlayer dielectric layer 530 may include, for example, silicon oxide (SiOx). A capping layer 520 may be disposed between the first and second interlayer dielectric layers 510 and 530. The capping layer 520 may include, for example, silicon nitride (SiNx).

A first pad 620 and a second pad 630 may be disposed in the second interlayer dielectric layer 530. The first and second pads 620 and 630 may penetrate the second interlayer dielectric layer 530 and the capping layer 520. The first pad 620 may be connected to the through via 200, and the second pad 630 may be connected to the first contact 610. The first and second pads 620 and 630 may not be provided depending on circumstances.

A third interlayer dielectric layer 540 may be disposed on the second interlayer dielectric layer 530. The third interlayer dielectric layer 540 may cover the second interlayer dielectric layer 530, the first pad 620, and the second pad 630. The third interlayer dielectric layer 540 may include, for example, silicon oxide (SiOx).

A third pad 650 may be disposed on the third interlayer dielectric layer 540. The third pad 650 may be connected to the first pad 620 through a second contact 640 provided in the third interlayer dielectric layer 540. In some example embodiments, the first pad 620 may not be provided, and the second contact 640 may directly contact the through via 200, and the third pad 650 may be connected through the second contact 640 to the through via 200. The first and second contacts 610 and 640 may include, for example, aluminum (Al) or tungsten (W). The first, second, and third pads 620, 630, and 650 may include, for example, aluminum (Al) or copper (Cu).

A first passivation layer 550 may be disposed on the third interlayer dielectric layer 540. The first passivation layer 550 may cover the second interlayer dielectric layer 530. The first passivation layer 550 may expose a portion of the third pad 650. The first passivation layer 550 may protect an integrated circuit including the semiconductor component 420 from an external environment. The first passivation layer 550 may include at least one of silicon oxide (SiOx) or silicon nitride (SiNx).

A second passivation layer 560 may be disposed on the second surface 100a of the substrate 100. The second passivation layer 560 may include at least one of silicon oxide (SiOx) or silicon nitride (SiNx).

A fourth pad 660 may be disposed in the second passivation layer 560. The fourth pad 660 may be connected to the through via 200. The fourth pad 660 may include, for example, copper (Cu).

Figure 4:
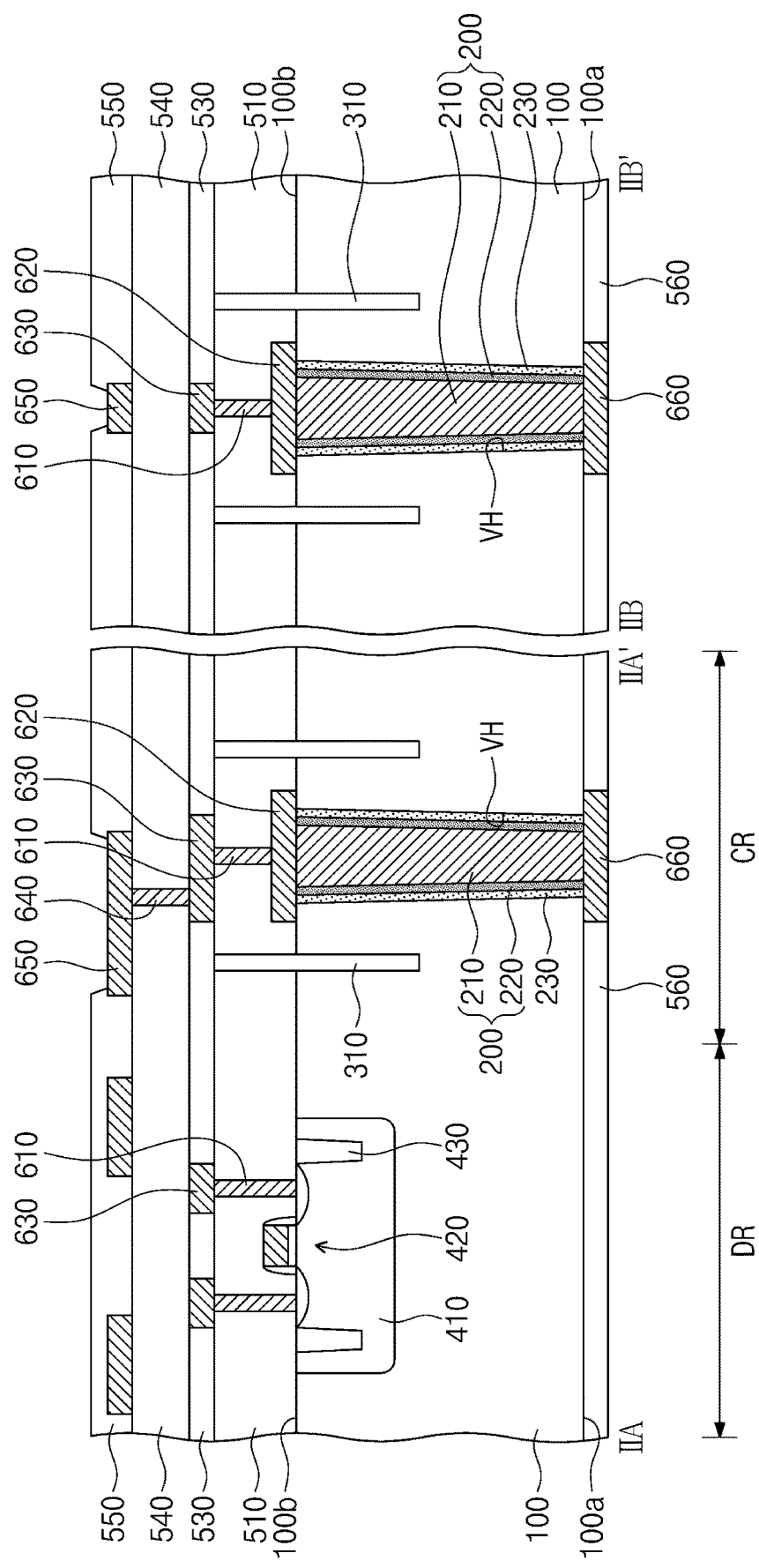
FIG. 4 illustrates a cross-sectional view of a semiconductor device taken along lines IIA-IIA' and IIB-IIB' of FIG. 1, according to an example embodiment of the present inventive concepts.

FIG. 4 illustrates a cross-sectional view of a semiconductor device taken along lines IIA-IIA' and IIB-IIB' of FIG. 1, showing a semiconductor device according to an example embodiment of the present inventive concepts. For convenience of description, the following will explain differences from those discussed with reference to FIGS. 1 to 3.

Referring to FIG. 4, the via hole VH may not penetrate the first interlayer dielectric layer 510. The top end of the via hole VH may be located at the same level as that of the first surface 100b of the substrate 100. The internal buffer structure 310 may penetrate the first interlayer dielectric layer 510. Therefore, the top end 310b of the internal buffer structure 310 may be located at a level higher than the top end of the through via 200. The through via 200 may include the barrier layer pattern 220 and the conductive layer pattern 210. In some example embodiments, the through via 200 (e.g., the conductive layer pattern 210) may include, for example, doped polysilicon.

The first pad 620 may be disposed on the first surface 100b of the substrate 100. The first pad 620 may be connected to the through via 200. The first interlayer dielectric layer 510 may cover the first pad 620 and the semiconductor component 420.

A plurality of second pads 630 may be disposed on the first interlayer dielectric layer 510. Each of the second pads 630 may be connected through the first contact 610 in the first interlayer dielectric layer 510 to a source/drain region of the semiconductor component 420 or to the first pad 620. The second interlayer dielectric layer 530 may cover the second pads 630.

The third pad 650 may be disposed on the second interlayer dielectric layer 530. The third pad 650 may be electrically connected to the second pad 630 through the second contact 640.

In some example embodiments, because a top end of the internal buffer structure 310 is provided at a level higher than that of the through via 200, it may be possible to effectively mitigate or block stress and delivered from the through via 200 through the first interlayer dielectric layer 510 and/or an upper portion of the substrate 100.

Figure 5:
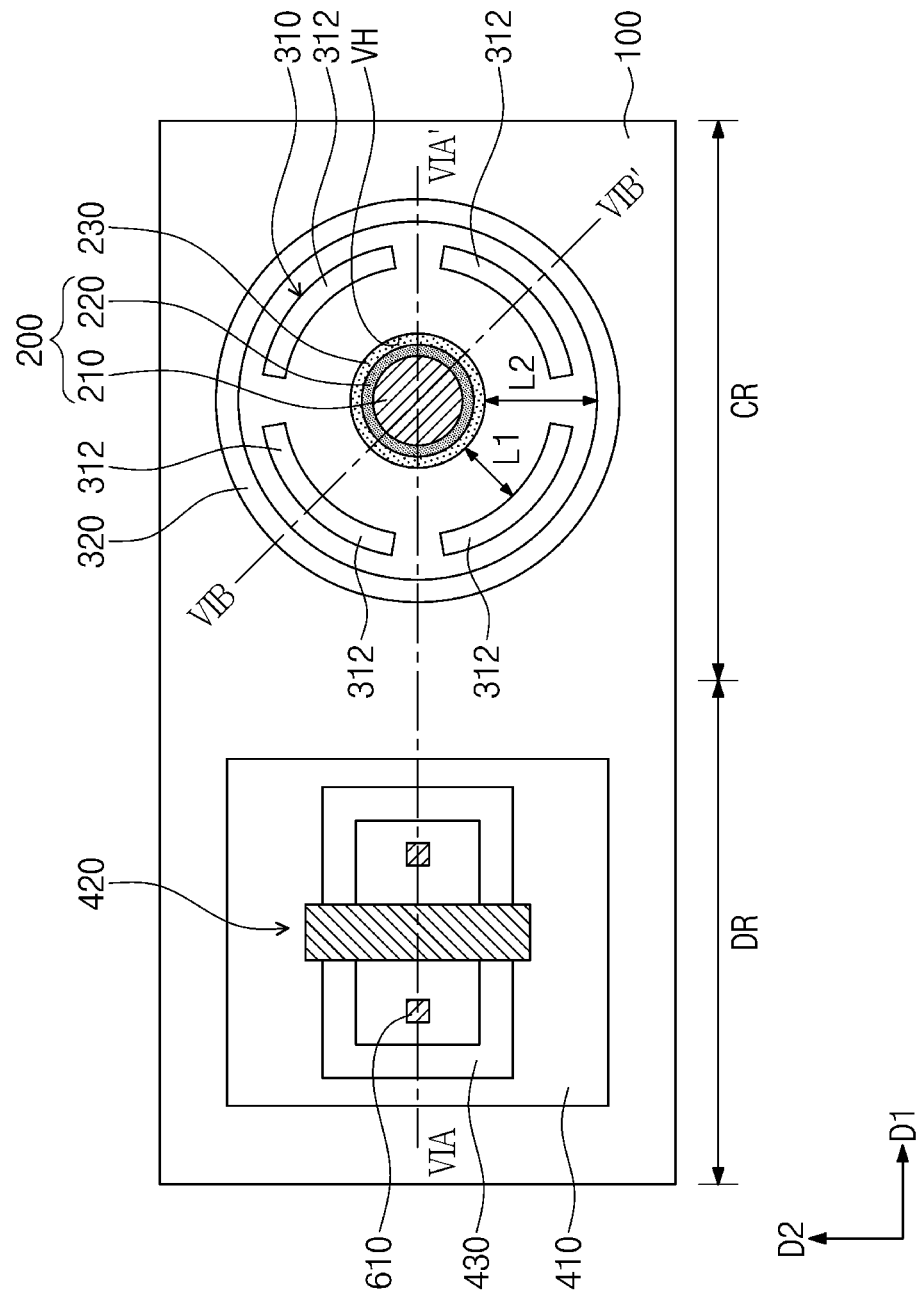
FIG. 5 illustrates a plan view showing a semiconductor device according to an example embodiment of the present inventive concepts.
Figure 6:
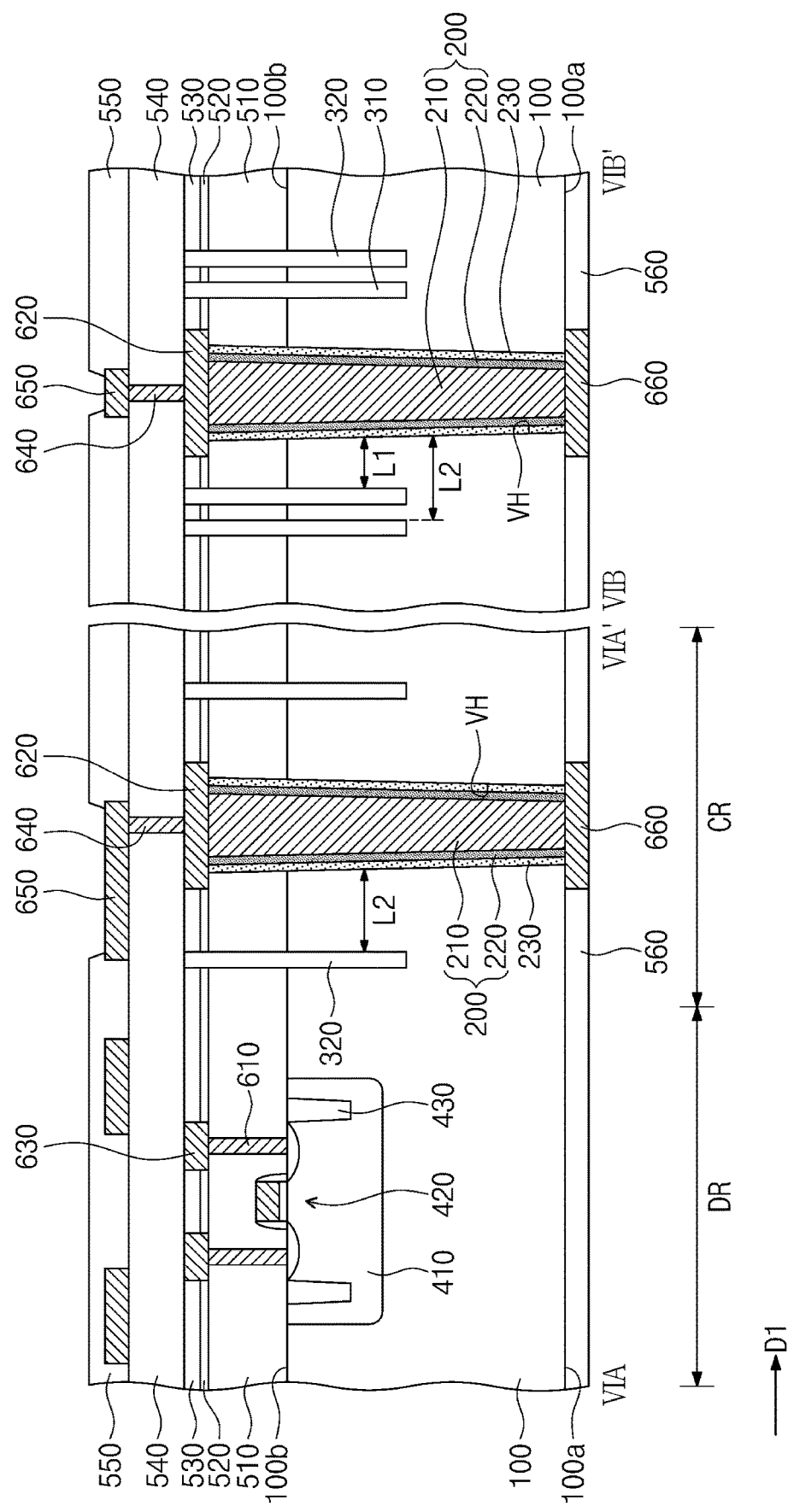
FIG. 6 illustrates a cross-sectional view of a semiconductor device taken along lines VIA-VIA' and VIB-VIB' of FIG. 5, according to an example embodiment of the present inventive concepts.

FIG. 5 illustrates a plan view showing a semiconductor device according to an example embodiment of the present inventive concepts. FIG. 6 illustrates a cross-sectional view of a semiconductor device taken along lines VIA-VIA' and B-B' of FIG. 5, according to an example embodiment of the present inventive concepts.

Referring to FIGS. 5 and 6, the internal buffer structure 310 may be an air gap that is formed in the substrate 100, the first interlayer dielectric layer 510, and the second interlayer dielectric layer 530. The internal buffer structure 310 may be spaced apart from the via hole VH. When viewed in a plan view, the internal buffer structure 310 may surround the via hole VH. For example, when viewed in a plan view, the internal buffer structure 310 may be a partially broken loop and may be spaced apart from the via hole VH by a first length (alternatively, first distance) L1. As shown in FIG. 5, the internal buffer structure 310 may have a shape that is broken at a straight line extending in a first direction D1 from a center of the through via 200 and is broken at a straight line extending in a second direction D2 from the center of the through via 200. FIG. 5 shows that, when viewed in a plan view, the shape of the internal buffer structure 310 is a broken loop in which, for example, four first segments 312 are arranged in a rotational direction. However, example embodiments of the present inventive concepts are not limited thereto. In some example embodiments, when viewed in a plan view, the shape of the internal buffer structure 310 may be a broken loop in which at least two first segments 312 are arranged in a rotational direction. A portion of the substrate 100 may be interposed between the first segments 312 of the internal buffer structure 310. In such cases, because no air gap is formed between the first segments 312 of the internal buffer structure 310, the through via 200 may be stably anchored in the via hole VH while improving structural stability of the substrate 100 in the vicinity of the through via 200.

An external buffer structure 320 may further be provided in the substrate 100. The external buffer structure 320 may be an air gap that is formed in the substrate 100, the first interlayer dielectric layer 510, and the second interlayer dielectric layer 530. The external buffer structure 320 may be spaced apart from the via hole VH. When viewed in a plan view, the external buffer structure 320 may surround the via hole VH. For example, when viewed in a plan view, the external buffer structure 320 may be a closed loop that is spaced apart at a second length L2 from the via hole VH. The second length L2 may be greater than the first length L1. When viewed in a plan view, the external buffer structure 320 may surround the internal buffer structure 310, while being spaced apart from the internal buffer structure 310. Each of the first and second lengths L1 and L2 may be less than a distance between the through via 200 and the semiconductor component 420.

In some example embodiments, the internal buffer structure 310 may include a plurality of first segments 312, thereby improving in structural stability of the through via 200 and the substrate 100.

Further, the external buffer structure 320 may further be provided outside the internal buffer structure 310. Accordingly, the semiconductor component 420 may be effectively protected from thermal stress associated with the through via 200. Therefore, a semiconductor device may reduce a size the keep-out zone. The combination of the internal and external buffer structures 310 and 320 may considerably reduce the keep-out zone, thereby increasing integration density of a semiconductor device.

Figure 7:
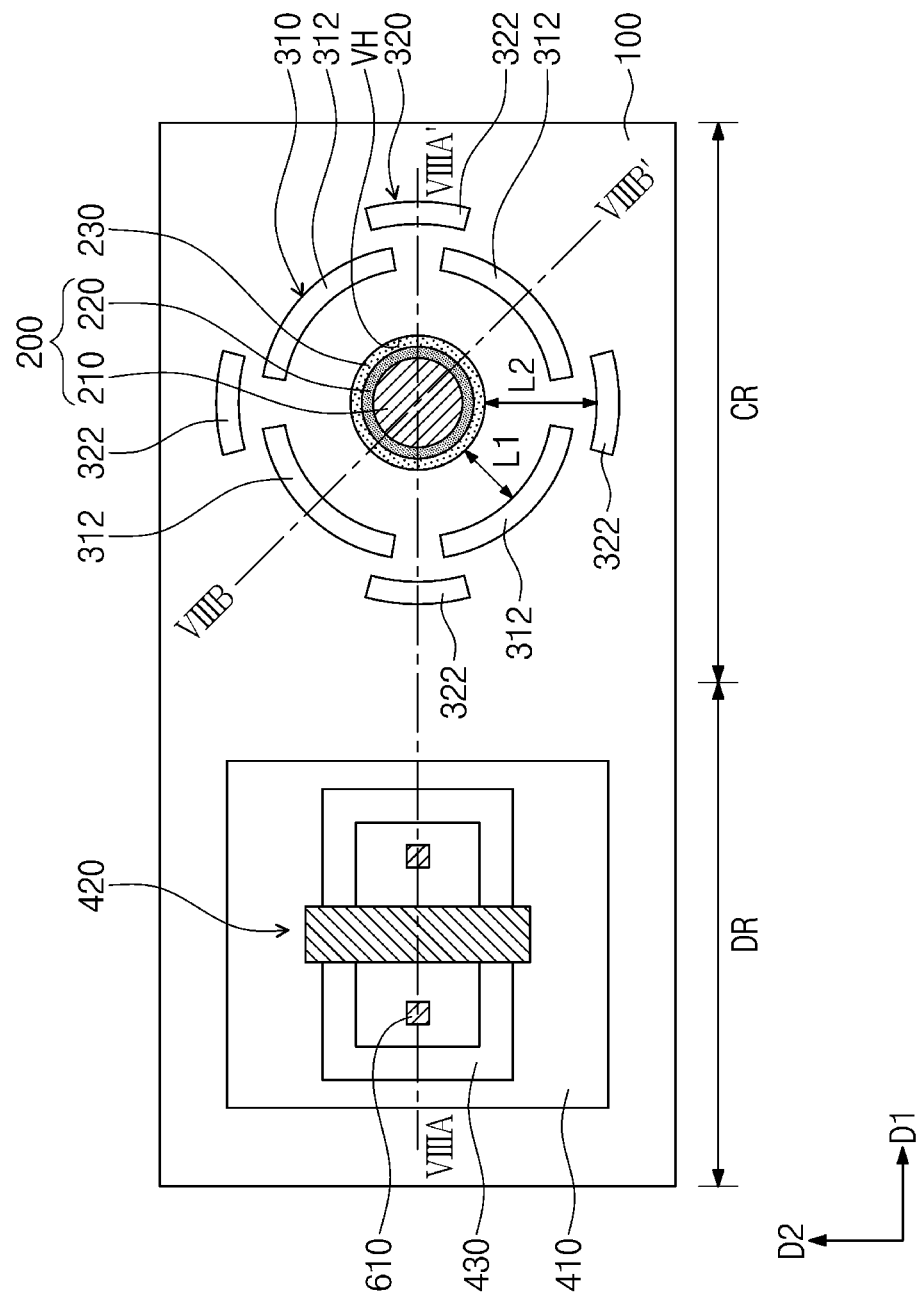
FIG. 7 illustrates a plan view showing a semiconductor device according to an example embodiment of the present inventive concepts.
Figure 8:
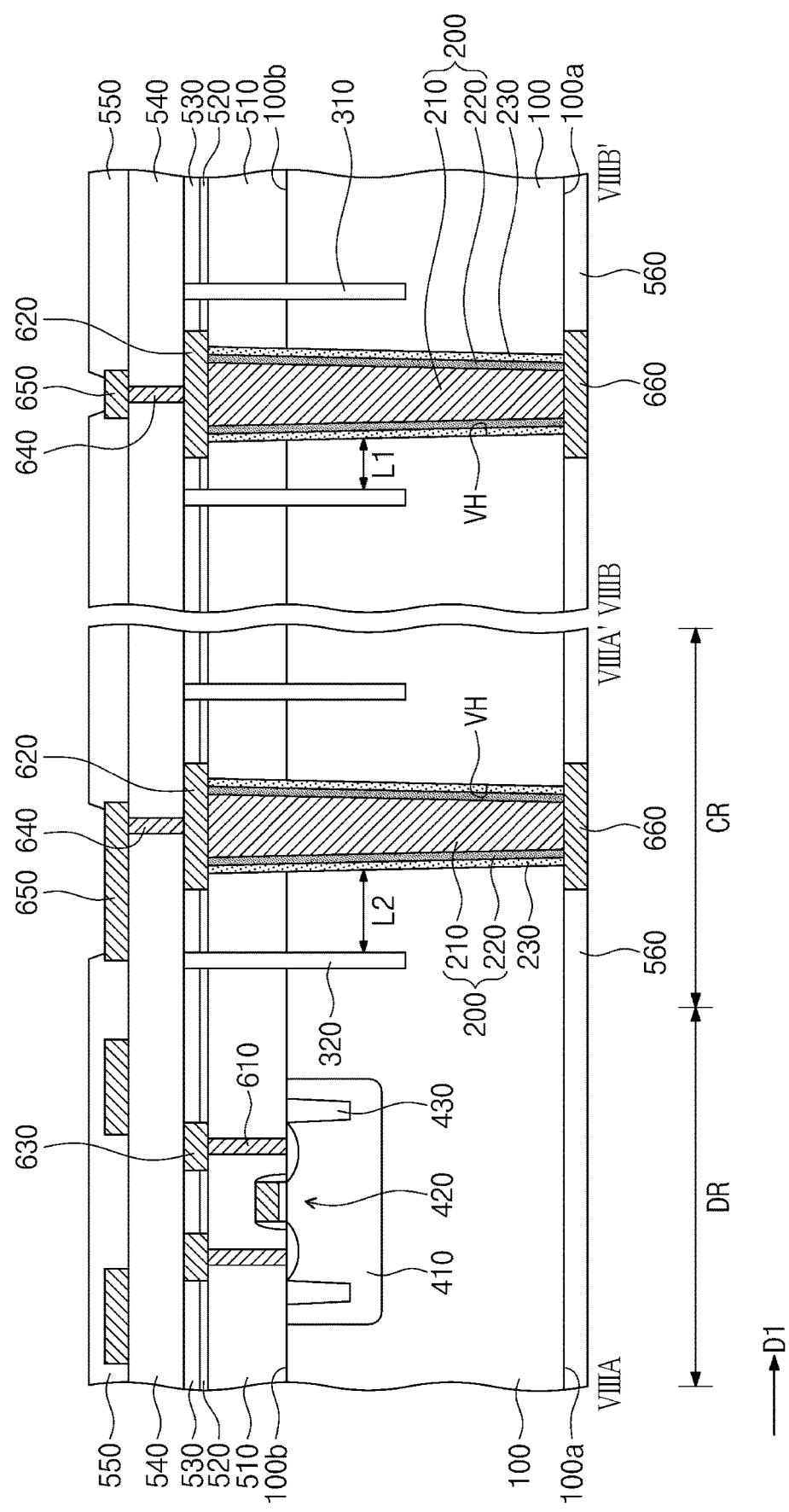
FIG. 8 illustrates a cross-sectional view of a semiconductor device taken along lines VIIIA-VIIIA' and VIIIB-VIIIB' of FIG. 7, according to some example embodiments of the present inventive concepts.

FIG. 7 illustrates a plan view showing a semiconductor device according to an example embodiment of the present inventive concepts. FIG. 8 illustrates a cross-sectional view of a semiconductor device taken along lines VIIIA-VIIIA' and VIIIB-VIIIB' of FIG. 7, showing a semiconductor device according to an example embodiment of the present inventive concepts.

Referring to FIGS. 7 and 8, the internal and external buffer structures 310 and 320 may be air gaps that are formed in the substrate 100, the first interlayer dielectric layer 510, and the second interlayer dielectric layer 530. The internal and external buffer structures 310 and 320 may extend from the first surface 100b toward the second surface 100a of the substrate 100. The internal and external buffer structures 310 and 320 may have their top ends at a level higher than the top end of the via hole VH. The internal and external buffer structures 310 and 320 may extend from the substrate 100 toward the top surface of the second interlayer dielectric layer 530. The internal and external buffer structures 310 and 320 may penetrate the first and second interlayer dielectric layers 510 and 530. The internal and external buffer structures 310 and 320 may have their depths less than the via hole VH, and thus may not penetrate the substrate 100.

When viewed in a plan view, the internal buffer structure 310 may surround the via hole VH, while being spaced apart from the via hole VH. For example, when viewed in a plan view, the internal buffer structure 310 may be a partially broken loop that is spaced apart at a first length L1 from the via hole VH. For example, as shown in FIG. 7, the internal buffer structure 310 may be a broken loop in which four first segments 312 are arranged in a rotational direction. The internal buffer structure 310 may have a depth less than the via hole VH, and thus may not penetrate the substrate 100.

When viewed in a plan view, the external buffer structure 320 may surround the via hole VH, while being spaced apart from the via hole VH. For example, when viewed in a plan view, the external buffer structure 320 may be a partially broken loop and may be spaced apart from the via hole VH by a second length (alternatively, second distance) L2. The second length L2 may be greater than the first length L1. As shown in FIG. 7, the external buffer structure 320 may include second segments 322 at opposite sides in the first direction D1 with respect to the via hole VH and at other opposite sides in the second direction D2 with respect to the via hole VH. FIG. 7 shows that, when viewed in a plan view, the shape of the external buffer structure 320 is a broken loop in which, for example, four second segments 322 are arranged in a rotational direction. However, example embodiments of the present inventive concepts are not limited thereto. In some example embodiments, when viewed in a plan view, the shape of the external buffer structure 320 may be a broken loop in which at least two second segments 322 are arranged in a rotational direction. When viewed in a plan view, each of the first segments 312 of the internal buffer structure 310 may not be disposed at a straight line connecting a center of the through via 200 to a center of each of the second segments 322 of the external buffer structure 320. According to the example embodiment, the second segments 322 of the external buffer structure 320 may effectively mitigate or prevent thermal stress associated with the through via 200 from being propagated through a space between the first segments 312 of the internal buffer structure 310. A portion of the substrate 100 may be interposed between the second segments 322 of the external buffer structure 320. Because no air gap is formed between the second segments 322 of the external buffer structure 320, structural stability at a location in the vicinity of the through via 200 of the substrate 100 may be improved.

FIGS. 9 to 16 illustrate cross-sectional views showing a method of fabricating a semiconductor device according to an example embodiment of the present inventive concepts.

Figure 9:
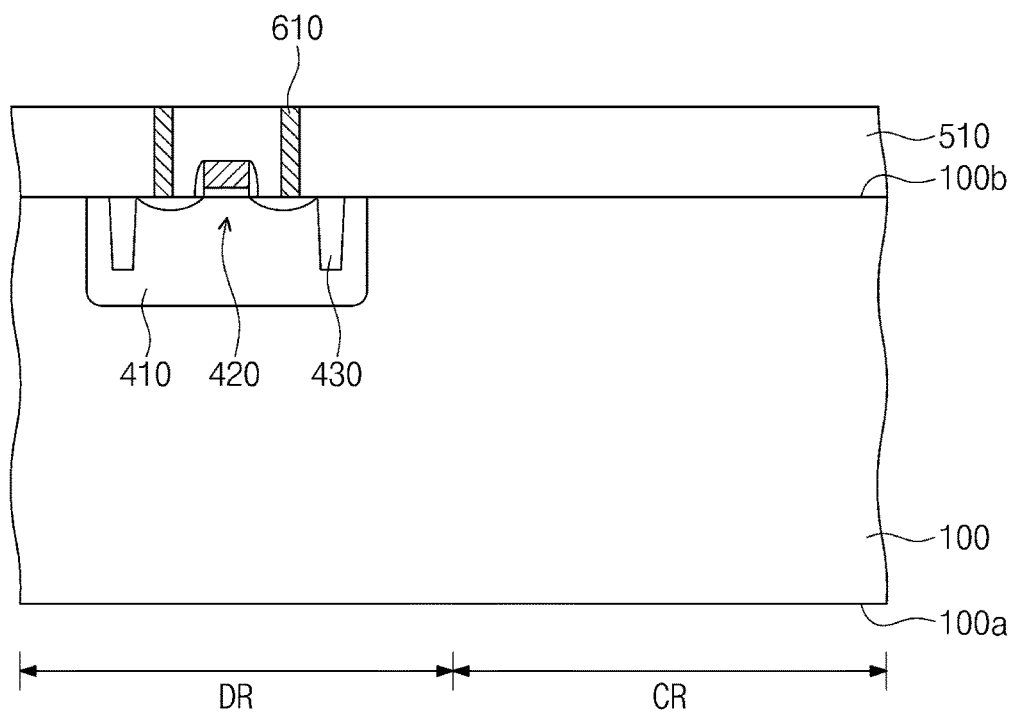
FIGS. 9 to 16 illustrate cross-sectional views showing a method of fabricating a semiconductor device according to an example embodiment of the present inventive concepts.

Referring to FIG. 9, a substrate 100 may be provided. The substrate 100 may include a connection region CR and a device region DR that is spaced apart from the connection region CR. The substrate 100 may have a first surface 100b and a second surface 100a facing the first surface 100b. The substrate 100 may be or include a semiconductor substrate. The substrate 100 may be doped with p-type impurities.

A well 410 may be formed on the device region DR of the substrate 100. For example, the well 410 may be formed by doping the first surface 100b of the substrate 100 with n-type or p-type impurities. The well 410 may be formed on the first surface 100b of the substrate 100.

A semiconductor component 420 may be formed in the well 410. The semiconductor component 420 may be or include a transistor. The semiconductor component 420 may be an NMOS, PMOS, or bipolar transistor.

A device isolation layer 430 may be formed in the well 410. For example, a shallow trench isolation (STI) process may be employed to form the device isolation layer 430. The device isolation layer 430 may surround the semiconductor component 420.

A first interlayer dielectric layer 510 may be formed on the first surface 100b of the substrate 100. For example, a silicon oxide layer may be deposited on the first surface 100b of the substrate 100 as the first interlayer dielectric layer 510 to cover the semiconductor component 420. A chemical vapor deposition (CVD) process may be performed to deposit the first interlayer dielectric layer 510.

A first contact 610 may be formed in the first interlayer dielectric layer 510. For example, the formation of the first contact 610 may include patterning the first interlayer dielectric layer 510 to form an opening that exposes a source/drain region of the semiconductor component 420, and then filling the opening with a conductive material. The first contact 610 may penetrate the first interlayer dielectric layer 510. The conductive material may include, for example, aluminum (Al) or tungsten (W).

Figure 10:
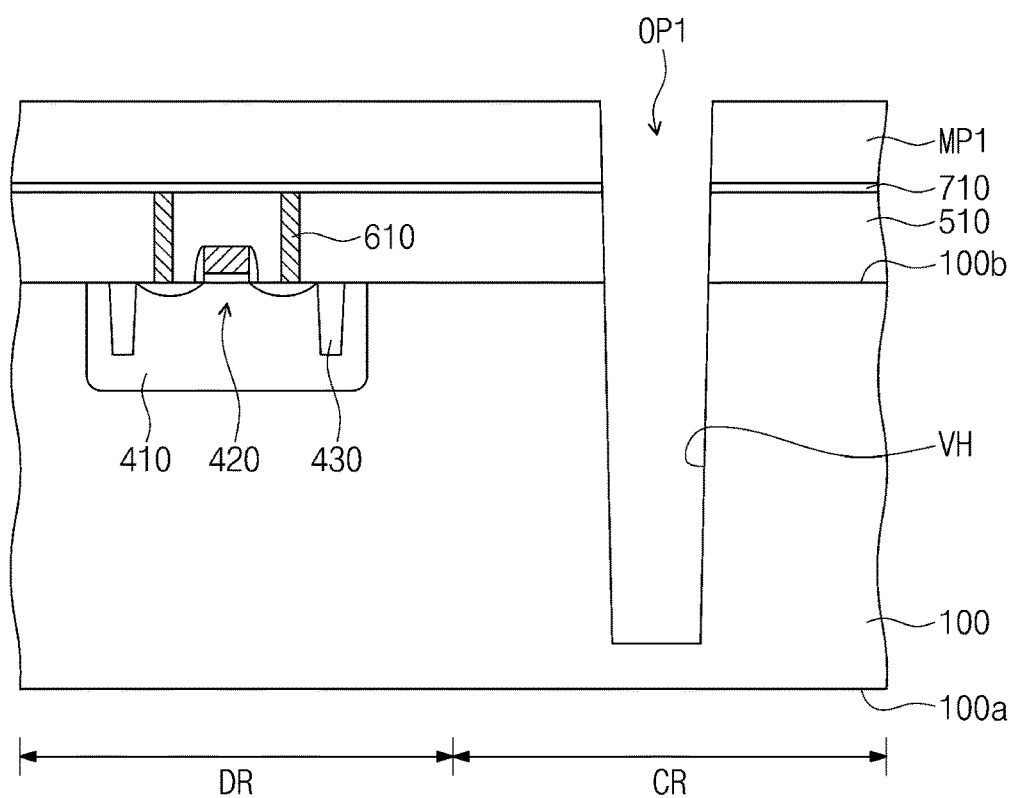

Referring to FIG. 10, an etch stop layer 710 may be formed on the first interlayer dielectric layer 510. The etch stop layer 710 may be formed by depositing, for example, a silicon nitride layer on the first interlayer dielectric layer 510.

A first mask pattern MP1 may be formed on the substrate 100. The first mask pattern MP1 may be formed by coating photoresist (not shown) on the etch stop layer 710. The first mask pattern MP1 may have a first opening OP1. The first opening OP1 may define an area where a via hole VH is formed in a subsequent process. The first opening OP1 may have a circular shape.

The substrate 100 may be etched through the first opening OP1 using the first mask pattern MP1 as an etching mask, thereby forming a via hole VH. The substrate 100 may be etched by, for example, a Bosch etching process or a steady etching process. The via hole VH may penetrate the etch stop layer 710 and the first interlayer dielectric layer 510, and may extend from the first surface 100b of the substrate 100 toward the second surface 100a of the substrate 100. The via hole VH may not penetrate the substrate 100, meaning that the via hole VH may not reach the second surface 100a of the substrate 100. The via hole VH may have a floor surface (or a bottom surface) higher than the second surface 100a of the substrate 100.

Figure 11:
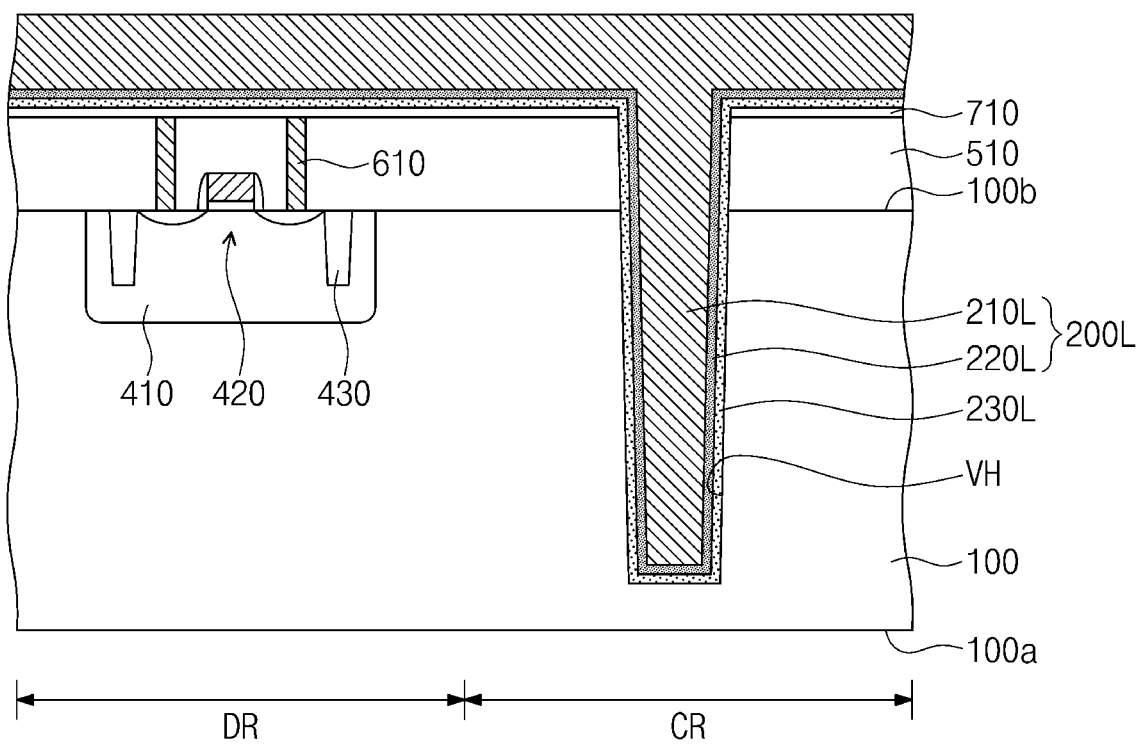

Referring to FIG. 11, after the first mask pattern MP1 is removed, a via dielectric layer 230L may be formed on the substrate 100. The via dielectric layer 230L may be formed by, for example, an $O_3$/TEOS chemical vapor deposition (CVD) process. The via dielectric layer 230L may conformally cover the first surface 100b of the substrate 100, an inner wall of the via hole VH, and the floor surface of the via hole VH. The via dielectric layer 230L may include, for example, silicon oxide (SiOx), silicon nitride (SiNx), or a combination thereof.

A through via layer 200L may be formed on the via dielectric layer 230L. For example, a barrier layer 220L may be formed on the via dielectric layer 230L. The barrier layer 220L may be formed along the inner wall of the via hole VH. For example, a sputtering process may be employed to form the barrier layer 220L. The barrier layer 220L may protect or prevent the substrate 100 from being attacked by metal originating from a conductive layer 210L to be formed thereon in the subsequent process. After that, a conductive layer 210L may be formed on the substrate 100. The conductive layer 210L may fill the via hole VH and extend onto the first surface 100b of the substrate 100. The conductive layer 210L may be formed by an electroplating process, an electroless plating process, or a selective deposition process. The electroplating process may be performed in such a way that a seed layer (not shown) is formed on the inner wall of the via hole VH (e.g., an inner wall of the barrier layer 220L), and then a conductive material is plated on the seed layer. The seed layer may be formed by a sputtering process. The conductive layers 210L may include, for example, metal. Through the processes above, the through via layer 200L including the barrier layer 220L and the conductive layer 210L may be formed in the via hole VH.

Figure 12:
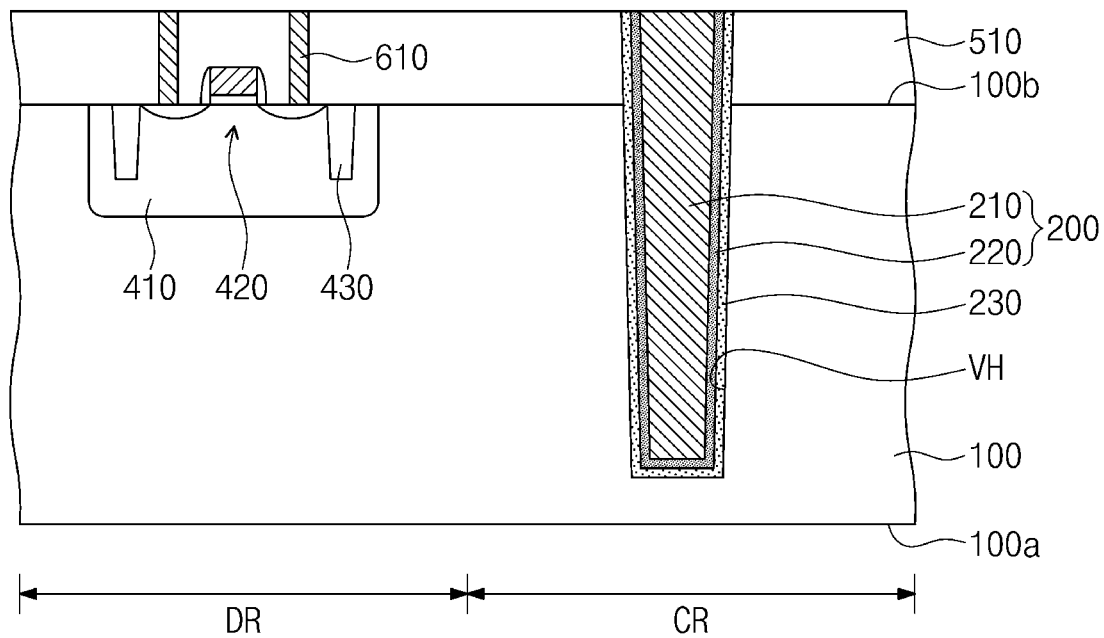

Referring to FIG. 12, a planarization process may be performed on the substrate 100. The planarization process may remove a portion of the through via layer 200L that is on the etch stop layer 710. The planarization process may also remove a portion of the etch stop layer 710 and a portion of the via dielectric layer 230L that are on the etch stop layer 710. Thus, a through via 200 including a barrier layer pattern 220 and a conductive layer pattern 210 may be formed. The planarization process may also remove a portion of the via dielectric layer 230L on the etch stop layer 710. Thus, a via dielectric layer pattern 230 may be formed.

Figure 13:
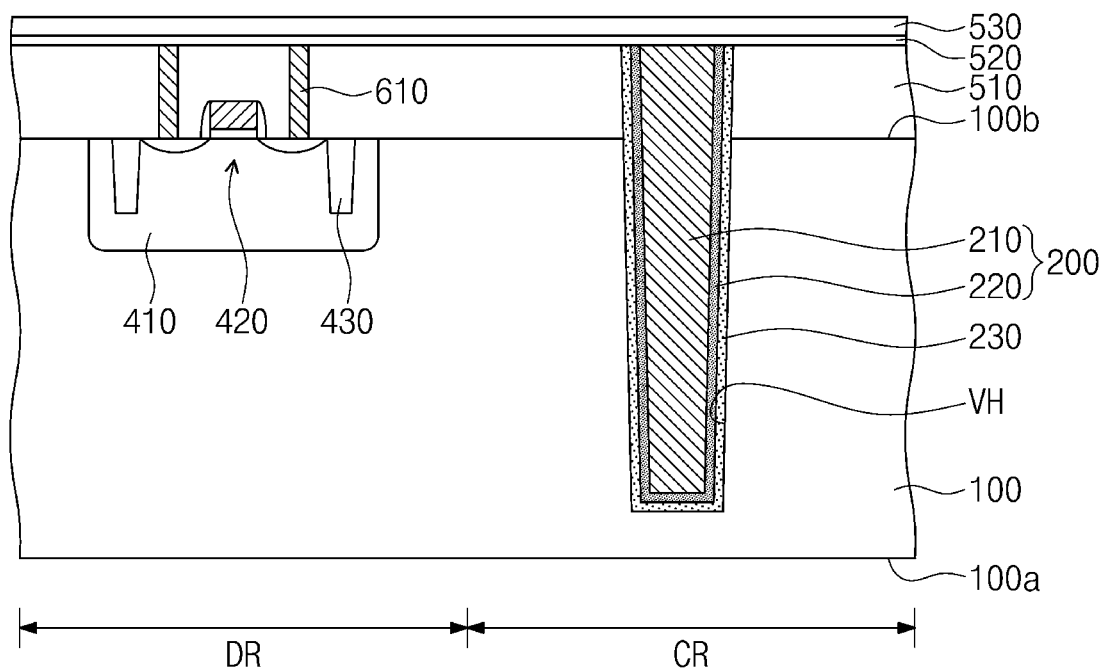

Referring to FIG. 13, a capping layer 520 may be formed on the substrate 100. The capping layer 520 may be formed by depositing, for example, a silicon nitride layer on the first interlayer dielectric layer 510. The capping layer 520 may cover a top surface of the through via 200 and a top surface of the first interlayer dielectric layer 510.

A second interlayer dielectric layer 530 may be formed on the substrate 100. The second interlayer dielectric layer 530 may be formed by depositing, for example, a silicon oxide layer on the capping layer 520. A chemical vapor deposition (CVD) process may be performed to deposit the second interlayer dielectric layer 530.

Figure 14:
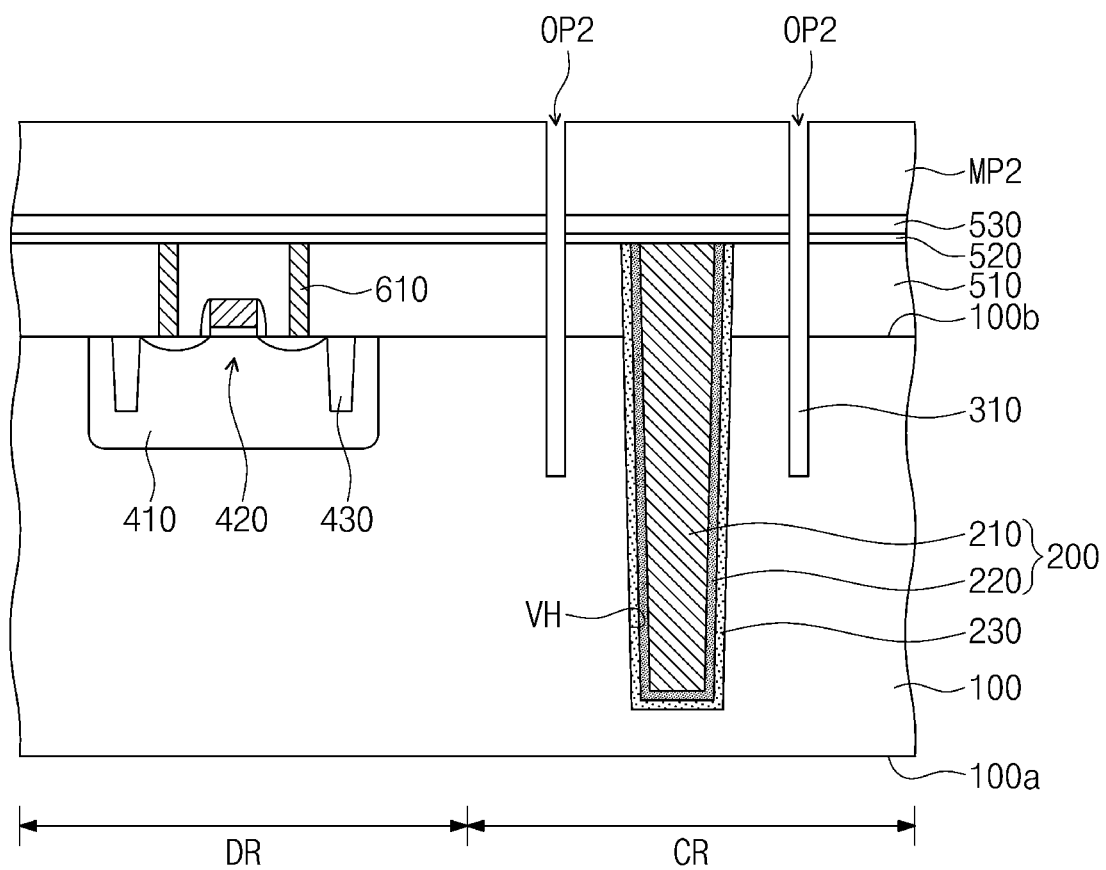

Referring to FIG. 14, a second mask pattern MP2 may be formed on the substrate 100. The second mask pattern MP2 may be formed by coating photoresist (not shown) on the second interlayer dielectric layer 530. The second mask pattern MP2 may have a second opening OP2. The second opening OP2 may define an area where an internal buffer structure 310 is formed in a subsequent process. When viewed in a plan view, the second opening OP2 may surround the via hole VH, while being spaced apart from the via hole VH. For example, the second opening OP2 may be a closed or broken loop that is spaced apart from the via hole VH by a first length (alternatively, first distance).

In some example embodiments, the second mask pattern MP2 may further include a third opening (not shown). The third opening may define an area where an external buffer structure (see 320 of FIGS. 5 and 7) is formed in a subsequent process. With reference to the planar shapes of the external buffer structure 320 shown in FIGS. 5 and 7, the third opening may be a closed or broken loop that is spaced apart from the via hole VH by a second length (alternatively, first distance) greater than the first length (alternatively, first distance). The following will describe an example in which the second mask pattern MP2 includes only the second opening OP2.

Figure 16:
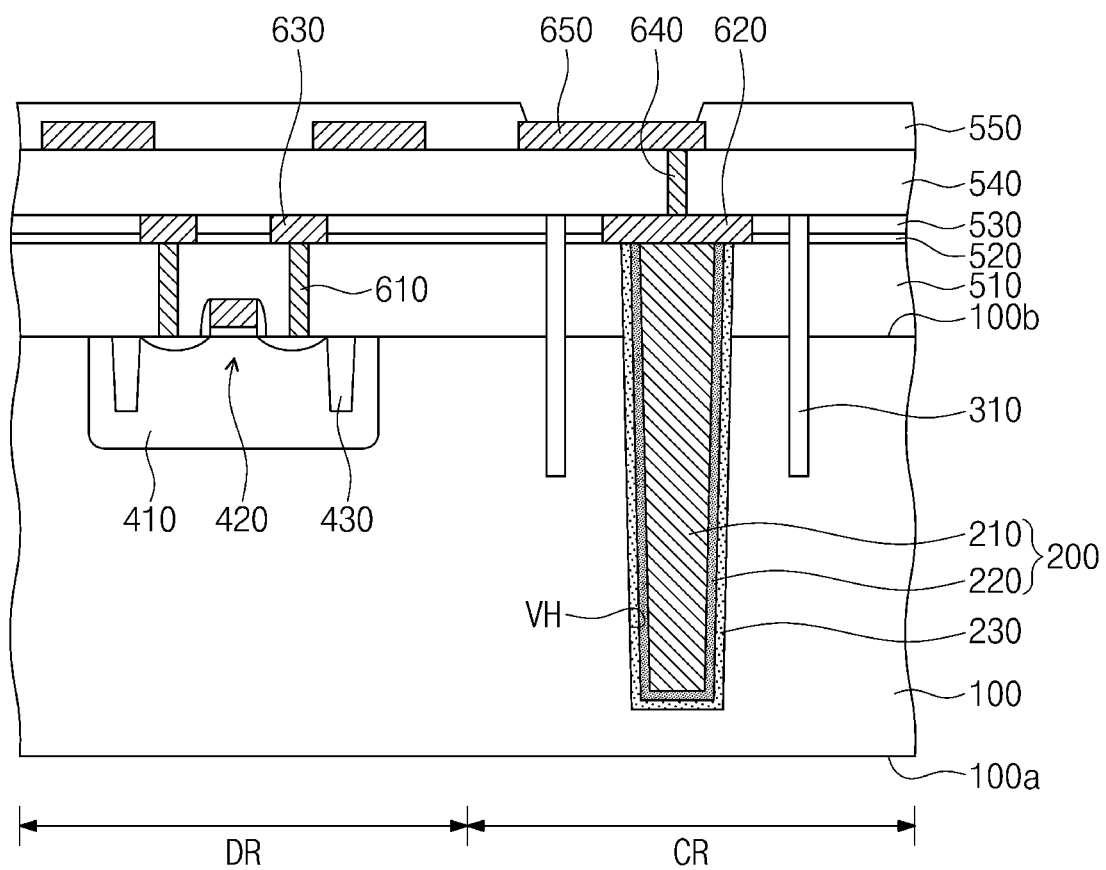

The second interlayer dielectric layer 530, the capping layer 520, the first interlayer dielectric layer 510, and the substrate 100 may be sequentially etched using the second mask pattern MP2 defining the second opening OP2 as an etching mask to form an internal buffer structure 310 (see FIG. 16). In some example embodiments, when the second mask pattern MP2 further includes the third opening, the foregoing etching process may also form an external buffer structure (see 320 of FIGS. 5 and 7) by sequentially etching the second interlayer dielectric layer 530, the capping layer 520, the first interlayer dielectric layer 510, and the substrate 100 through the third opening. In some example embodiments, a laser drilling process may be performed instead of the etching process. The internal buffer structure 310 may penetrate the second interlayer dielectric layer 530, the capping layer 520, and the first interlayer dielectric layer 510, and may extend from the first surface 100b of the substrate 100 toward the second surface 100a of the substrate 100. The internal buffer structure 310 may not penetrate the substrate 100. The internal buffer structure 310 may have a bottom end 310a higher than a bottom end of the via hole VH.

In some example embodiments, the etching process for forming the internal and external buffer structures 310 and 320 may be performed separately from the etching process for forming the via hole VH. Accordingly, the internal and external buffer structures 310 and 320 may be formed to have a desired depth independently from the via hole forming process, and the substrate 100 may not be over-etched. Thus, structural stability of a semiconductor device fabricated by the method according to the example embodiment may be improved.

Figure 15:
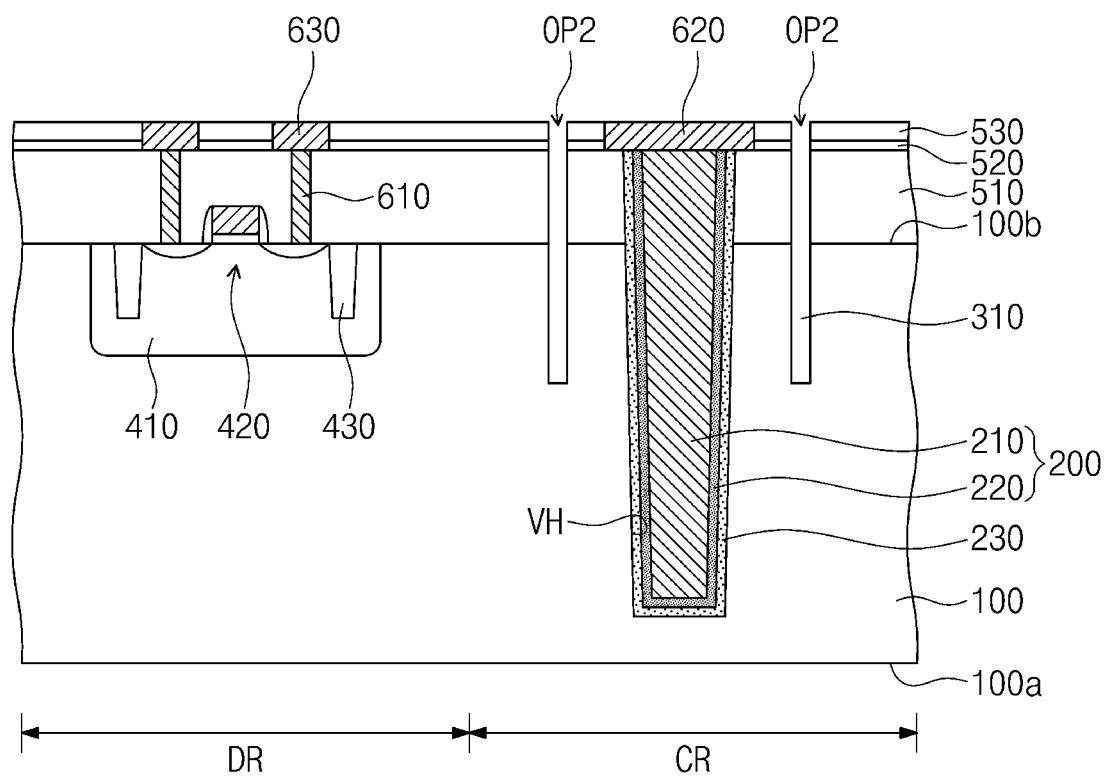

Referring to FIG. 15, after the second mask pattern MP2 is removed, a first pad 620 and a second pad 630 may be formed in the second interlayer dielectric layer 530. For example, a damascene process may be performed to form the first and second pads 620 and 630. The first pad 620 may be connected to the through via 200 while penetrating through the second interlayer dielectric layer 530 and the capping layer 520. The second pad 630 may be connected to the first contact 610 while penetrating through the second interlayer dielectric layer 530 and the capping layer 520.

In some example embodiments, the first and second pads 620 and 630 may not be formed depending on circumstances.

Referring to FIG. 16, a third interlayer dielectric layer 540 may be formed on the substrate 100. For example, the third interlayer dielectric layer 540 may be formed by depositing, for example, a silicon oxide layer on a top surface of the second interlayer dielectric layer 530. A chemical vapor deposition (CVD) process may be performed to deposit the third interlayer dielectric layer 540.

A second contact 640 may be formed in the third interlayer dielectric layer 540. For example, the formation of the second contact 640 may include patterning the third interlayer dielectric layer 540 to form an opening that exposes the first pad 620, and then filling the opening with a conductive material. In case that the first pad 620 is not be formed, the formation of the second contact 640 may include forming an opening that exposes the through via 200 by patterning the third interlayer dielectric layer 540, the second interlayer dielectric layer 530, and the capping layer 520, and then filling the opening with a conductive material. The second contact 640 may penetrate through the third interlayer dielectric layer 540. The conductive material may include, for example, aluminum (Al) or tungsten (W).

A third pad 650 may be formed on the third interlayer dielectric layer 540. The third pad 650 may be connected to the second contact 640. In some example embodiments, a damascene process may be used to form the third pad 650 like the first pad 620 and the second pad 630 forming process described above.

A first passivation layer 550 may be formed on the third interlayer dielectric layer 540. For example, the first passivation layer 550 may be formed by depositing, for example, a silicon oxide layer or a silicon nitride layer on the third interlayer dielectric layer 540. The first passivation layer 550 may cover the third interlayer dielectric layer 540 and expose a portion of the third pad 650.

Referring back to FIG. 2, a polishing process may be performed on the second surface 100a of the substrate 100. For example, a carrier substrate may be attached to the first passivation layer 550 on the substrate 100. The carrier substrate may relieve mechanical stress that is applied to the substrate 100 when the polishing process is performed on the second surface 100a of the substrate 100, and may mitigate or prevent the substrate 100 from being warped while performing the polishing process. After the attachment of the carrier substrate, the polishing process may be performed on the second surface 100a of the substrate 100. A grinding process may be performed as the polishing process such that the through via 200 is exposed at the second surface 100a of the substrate 100 while not exposing the internal buffer structure 310 at the second surface 100a.

A second passivation layer 560 may be formed on the second surface 100a of the substrate 100. For example, the second passivation layer 560 may be formed by depositing, for example, a silicon oxide layer or a silicon nitride layer on the second surface 100a of the substrate 100.

A fourth pad 660 may be formed in the second passivation layer 560. The fourth pad 660 may be connected to the through via 200. The above-mentioned processes may fabricate a semiconductor device shown in FIGS. 1 and 2.

FIGS. 17 to 23 illustrate cross-sectional views showing a method of manufacturing a semiconductor package according to an example embodiment of the present inventive concepts.

Figure 17:
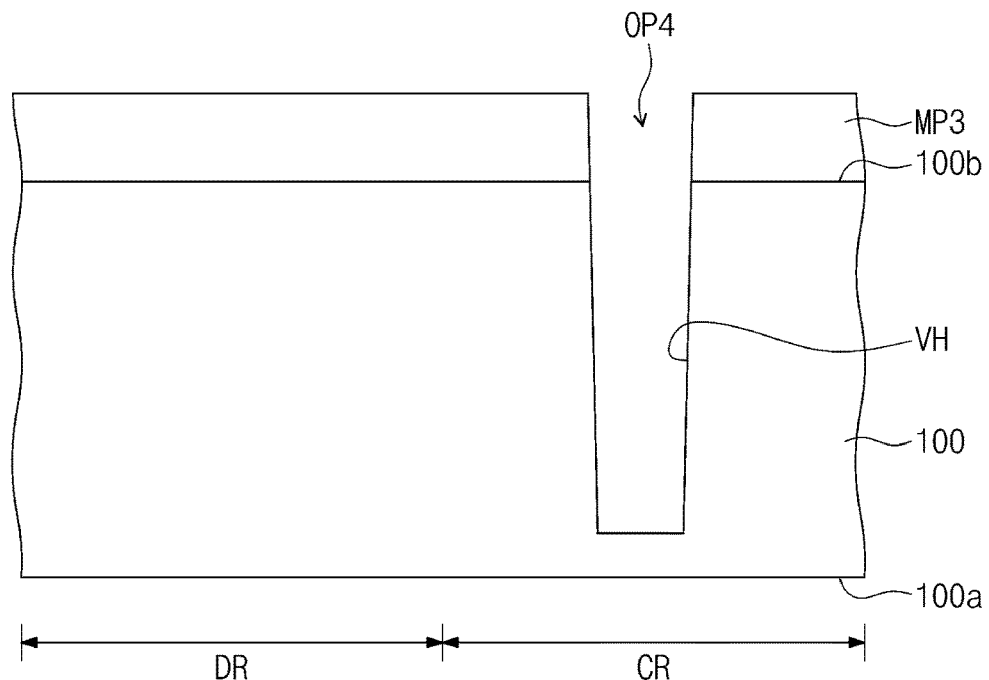
FIGS. 17 to 23 illustrate cross-sectional views showing a method of fabricating a semiconductor device, according to an example embodiment of the present inventive concepts.

Referring to FIG. 17, a substrate 100 may be provided. The substrate 100 may include a connection region CR and a device region DR spaced apart from the connection region CR. The substrate 100 may have a first surface 100b and a second surface 100a facing the first surface 100b.

A third mask pattern MP3 may be formed on the substrate 100. The third mask pattern MP3 may be formed by coating photoresist (not shown) on the first surface 100b of the substrate 100. The third mask pattern MP3 may have a fourth opening OP4. The fourth opening OP4 may define an area where a via hole VH is formed in a subsequent process. The fourth opening OP4 may have a circular shape.

The substrate 100 may be etched using the third mask pattern MP3 defining the fourth opening OP4 as an etching mask to form a via hole VH. The substrate 100 may be etched by, for example, a Bosch etching process or a steady etching process. The via hole VH may extend from the first surface 100b of the substrate 100 toward the second surface 100a of the substrate 100. The via hole VH may not penetrate the substrate 100. The via hole VH may have a floor surface (alternatively, a bottom surface or a bottom end) higher than the second surface 100a of the substrate 100.

Figure 18:
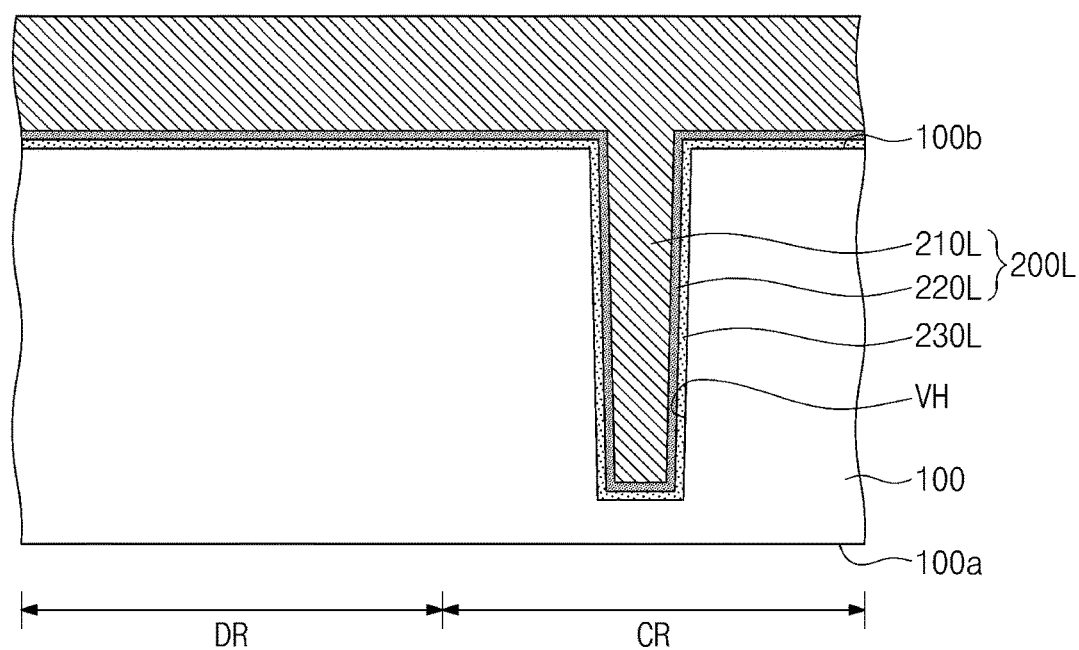

Referring to FIG. 18, after the third mask pattern MP3 is removed, a via dielectric layer 230L may be formed on the substrate 100. The via dielectric layer 230L may be formed by, for example, an O$_3$/TEOS CVD process. The via dielectric layer 230L may conformally cover the first surface 100b of the substrate 100, an inner wall of the via hole VH, and the floor surface of the via hole VH.

A through via layer 200L may be formed on the via dielectric layer 230L. For example, a barrier layer 220L may be formed on the via dielectric layer 230L. The barrier layer 220L may be formed along the inner wall of the via hole VH. For example, a sputtering process may be performed to form the barrier layer 220L. After that, a conductive layer 210L may be formed on the substrate 100 (e.g., on the barrier layer 220L). The conductive layer 210L may fill the via hole VH and extend onto the first surface 100b of the substrate 100. The conductive layer 210L may be formed by an electroplating process, an electroless plating process, or a selective deposition process. Through the processes above, the through via layer 200L including the barrier layer 220L and the conductive layer 210L may be formed in the via hole VH.

Figure 19:
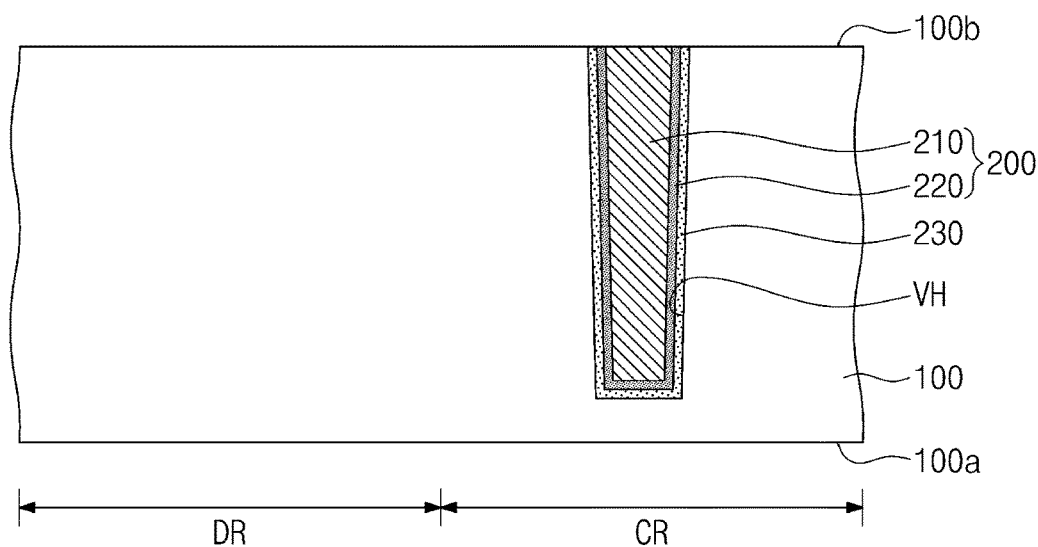

Referring to FIG. 19, a planarization process may be performed on the substrate 100. The planarization process may remove a portion of the through via layer 200L on the first surface 100b of the substrate 100. Thus, a through via 200 including a barrier layer pattern 220 and a conductive layer pattern 210 may be formed. The planarization process may also remove a portion of the via dielectric layer 230L on the first surface 100b of the substrate 100. Thus, a via dielectric layer pattern 230 may be formed.

Figure 20:
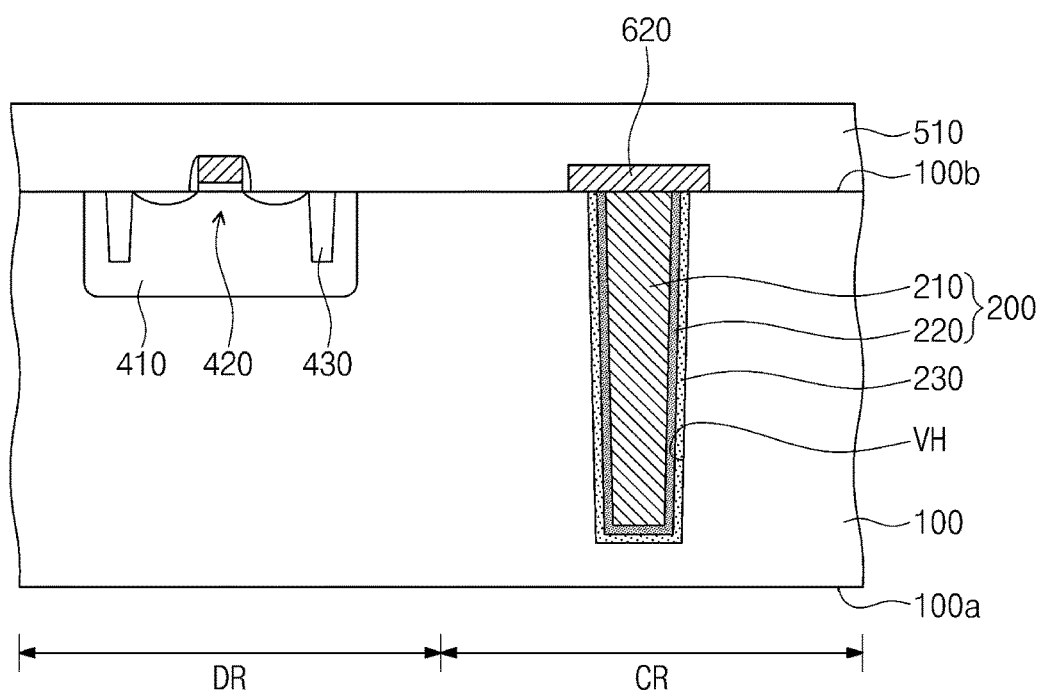

Referring to FIG. 20, a well 410 may be formed on the device region DR of the substrate 100. The well 410 may be formed on the first surface 100b of the substrate 100. The well 410 may be formed by doping impurity ions into the first surface 100b of the substrate 100. A semiconductor component 420 may be formed in the well 410. The semiconductor component 420 may be or include a transistor. A device isolation layer 430 may be formed in the well 410. A shallow trench isolation (STI) process may be performed to form the device isolation layer 430. The device isolation layer 430 may surround the semiconductor component 420.

A first pad 620 may be formed on the substrate 100. The first pad 620 may be provided on the first surface 100b of the substrate 100 and connected to the through via 200.

A first interlayer dielectric layer 510 may be formed on the substrate 100. For example, a silicon nitride layer may be deposited on the first surface 100b of the substrate 100 as the first interlayer dielectric layer 510 to cover the semiconductor component 420 and the first pad 620.

Figure 21:
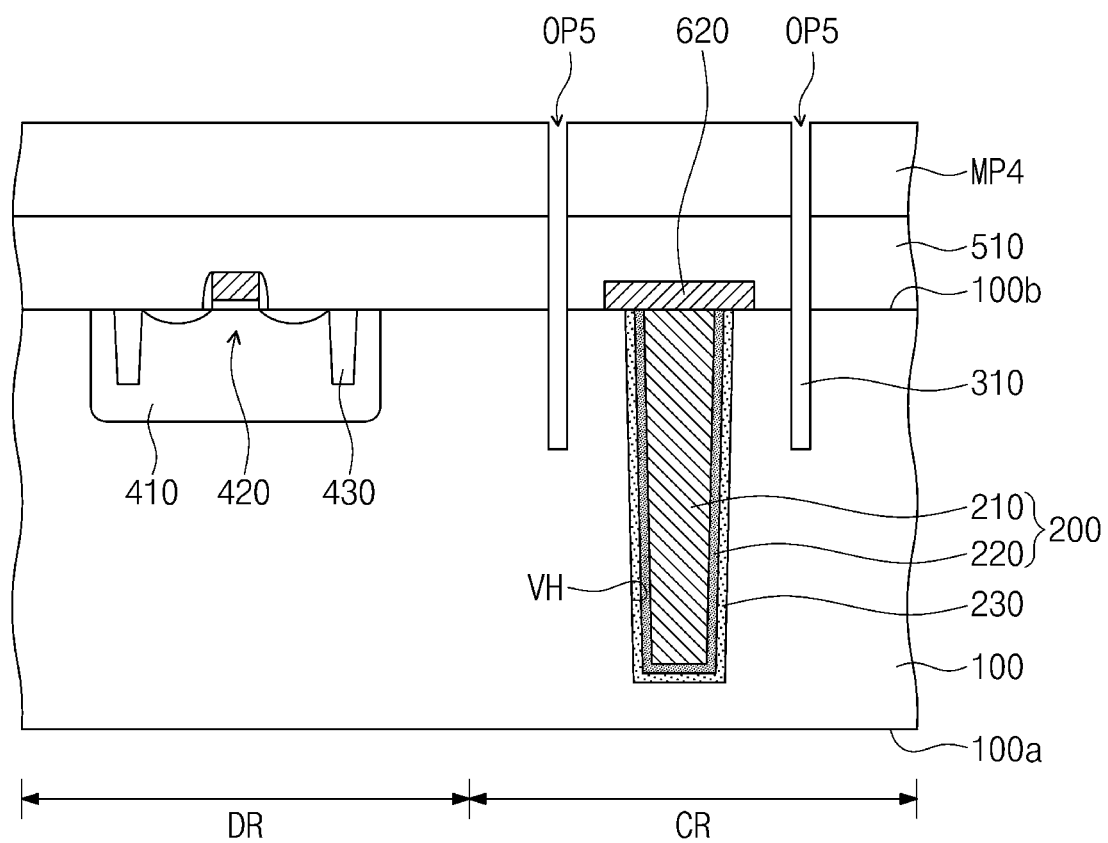

Referring to FIG. 21, a fourth mask pattern MP4 may be formed on the substrate 100. The fourth mask pattern MP4 may be formed by coating photoresist (not shown) on the first interlayer dielectric layer 510. The fourth mask pattern MP4 may have a fifth opening OP5. The fifth opening OP5 may define an area where an internal buffer structure 310 is formed in a subsequent process. When viewed in a plan view, the fifth opening OP5 may surround the via hole VH, while being spaced apart from the via hole VH. For example, the fifth opening OP5 may be a closed or broken loop that is spaced apart at a first length (alternatively, first distance) from the via hole VH.

In some example embodiments, the fourth mask pattern MP4 may further include a sixth opening (not shown). The sixth opening may define an area where an external buffer structure (see 320 of FIGS. 5 and 7) is formed in a subsequent process.

The first interlayer dielectric layer 510 and the substrate 100 may be etched using the fourth mask pattern MP4 defining the fifth opening OP5 as an etching mask to form an internal buffer structure 310. In some example embodiments, the fourth mask pattern MP4 may further include the sixth opening defining the sixth opening, and an external buffer structure (see 320 of FIGS. 5 and 7) may be formed by etching the first interlayer dielectric layer 510 and the substrate 100 using the fourth mask pattern MP4 defining the sixth opening as an etching mask. In some example embodiments, a laser drilling process may be performed instead of the etching process.

Figure 22:
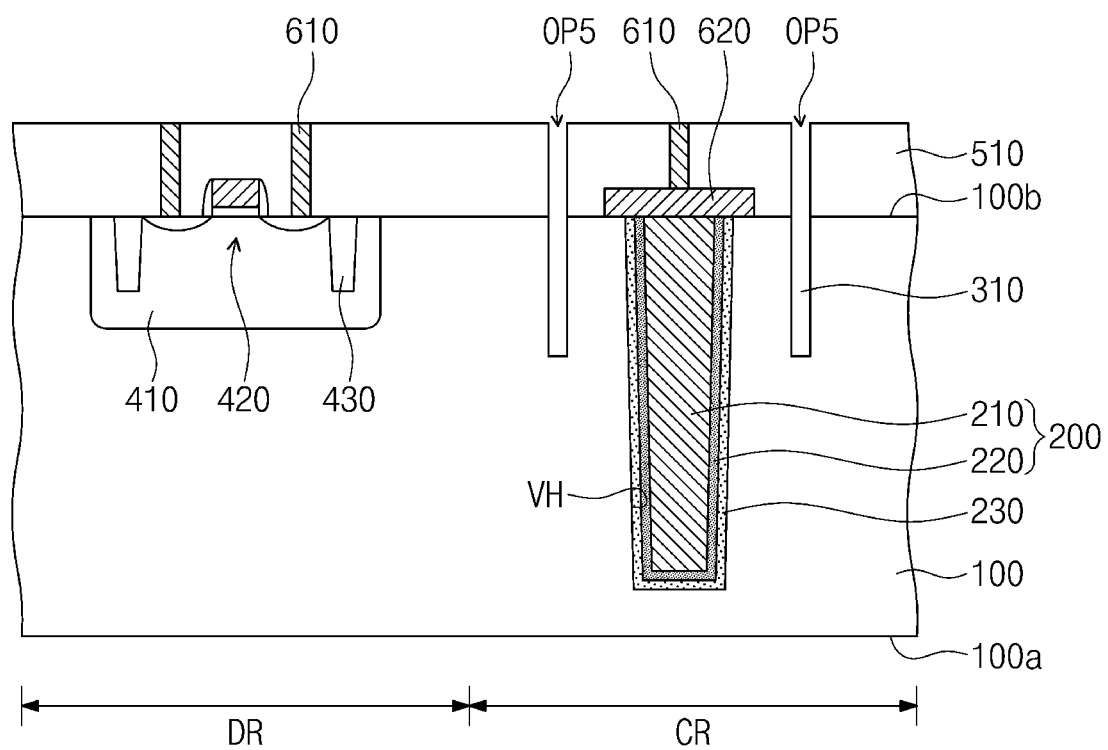

Referring to FIG. 22, after the fourth mask pattern MP4 is removed, first contacts 610 may be formed in the first interlayer dielectric layer 510. For example, the formation of the first contacts 610 may include patterning the first interlayer dielectric layer 510 to form openings that expose the first pad 620 and a source/drain region of the semiconductor component 420, and then filling the openings with a conductive material.

Figure 23:
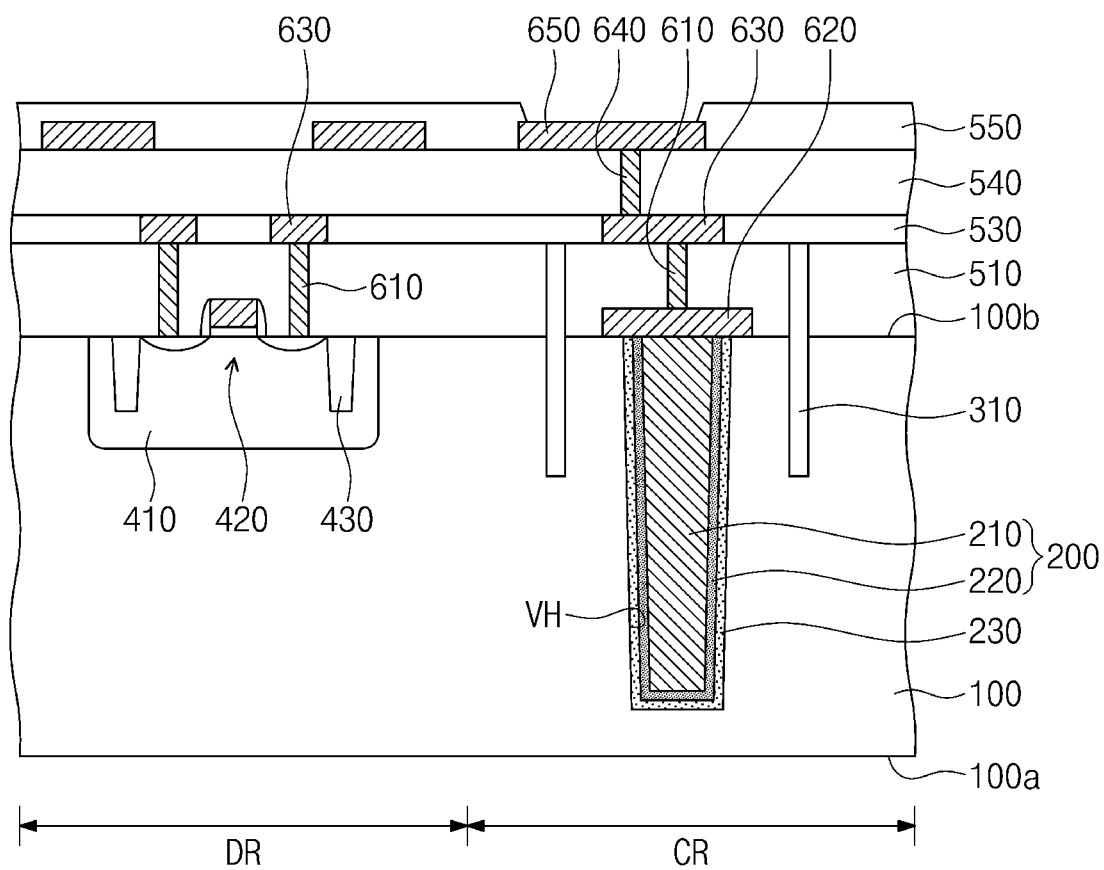

Referring to FIG. 23, second pads 630 may be formed on the substrate 100. For example, a damascene process may be performed to form the second pads 630. The second pads 630 may be provided on a top surface of the first interlayer dielectric layer 510 and connected to the first contacts 610.

A second interlayer dielectric layer 530 may be formed on the substrate 100. The second interlayer dielectric layer 530 may be formed by depositing, for example, a silicon oxide layer on the first interlayer dielectric layer 510. A chemical vapor deposition (CVD) process may be performed to deposit the second interlayer dielectric layer 530.

A third interlayer dielectric layer 540 may be formed on the second interlayer dielectric layer 530. The third interlayer dielectric layer 540 may be formed by depositing, for example, a silicon oxide layer on the second interlayer dielectric layer 530. A chemical vapor deposition (CVD) process may be performed to deposit the third interlayer dielectric layer 540. The formation of the third interlayer dielectric layer 540 may be performed successively to the second interlayer dielectric layer 530, and thus the second and third interlayer dielectric layers 530 and 540 may be formed as a substantially single integral layer.

A second contact 640 may be formed in the third interlayer dielectric layer 540. For example, the formation of the second contact 640 may include patterning the third interlayer dielectric layer 540 to form an opening that exposes the second pad 630, and then filling the opening with a conductive material.

A third pad 650 may be formed on the third interlayer dielectric layer 540. For example, a damascene process may be performed to form the third pad 650. The third pad 650 may be connected to the second contact 640.

A first passivation layer 550 may be formed on the third interlayer dielectric layer 540. For example, the first passivation layer 550 may be formed by depositing, for example, a silicon oxide layer or a silicon nitride layer on the third interlayer dielectric layer 540.

Referring back to FIG. 4, a polishing process may be performed on the second surface 100a of the substrate 100. For example, a carrier substrate may be attached to the first passivation layer 550 on the substrate 100. After the attachment of the carrier substrate, the polishing process may be performed on the second surface 100a of the substrate 100. A grinding process may be performed as the polishing process. The through via 200 may be exposed on the second surface 100a of the substrate 100. The internal buffer structure 310 may not be exposed on the second surface 100a.

A second passivation layer 560 may be formed on the second surface 100a of the substrate 100. For example, the second passivation layer 560 may be formed by depositing, for example, a silicon oxide layer or a silicon nitride layer on the second surface 100a.

A fourth pad 660 may be formed in the second passivation layer 560. The fourth pad 660 may be connected to the through via 200. The above-mentioned processes may fabricate a semiconductor device shown in FIG. 4.

According to some example embodiments of the present inventive concepts, the internal buffer layer may mitigate or prevent thermal stress from being transmitted from the through via to the well. Thus, structural stability of a semiconductor device may be improved. Furthermore, the internal buffer structure may reduce the keep-out zone, and thus integration density of the semiconductor device may increase.

Although the present inventive concepts has been described in connection with the some example embodiments illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A semiconductor device, comprising:
a substrate having a first surface and a second surface facing the first surface, the substrate having a via hole, the via hole extending from the first surface of the substrate toward the second surface of the substrate;
a through via in the via hole;
a semiconductor component on the first surface of the substrate; and
an internal buffer structure being outside the via hole, spaced apart from the via hole, and between the via hole and the semiconductor component, the internal buffer structure extending from the first surface of the substrate toward an inside of the substrate, a top end of the internal buffer structure being at a level higher than a top end of the through via.

2. The semiconductor device of claim 1, wherein the internal buffer structure surrounds the via hole.

3. The semiconductor device of claim 2, wherein, when viewed in a plan view, the internal buffer structure is a closed loop, the closed loop being spaced apart from a center of the via hole by a first distance.

4. The semiconductor device of claim 2, wherein the internal buffer structure includes a plurality of first segments, the first segments being spaced apart from each other, each of the first segments being spaced apart from a center of the via hole by a first distance.

5. The semiconductor device of claim 1, wherein
a bottom end of the internal buffer structure is at a level higher than a bottom end of the via hole such that the internal buffer structure does not fully penetrate the substrate.

6. The semiconductor device of claim 5, wherein
the substrate includes a well extending from the first surface thereof, the well having the semiconductor component thereon, and
the bottom end of the internal buffer structure is located at a same level as a bottom end of the well.

7. The semiconductor device of claim 5, wherein a depth of the internal buffer structure is within a range from about 150 nm to about 500 nm from the first surface of the substrate.

8. The semiconductor device of claim 1, further comprising:
an interlayer dielectric layer on the first surface of the substrate, the interlayer dielectric layer covering the semiconductor component,
wherein a top end of the via hole is at a same level as the first surface of the substrate, and wherein the top end of the internal buffer structure is at a same level as a top surface of the interlayer dielectric layer.

9. The semiconductor device of claim 1, wherein the internal buffer structure is an air gap from which a portion of the substrate is removed.

10. The semiconductor device of claim 1, further comprising:
an external buffer structure surrounding the via hole and, the external buffer structure being spaced apart from a center of the via hole at a distance,
wherein the distance is greater than a distance between the internal buffer structure and the center of the via hole.

11. A semiconductor device, comprising:
a substrate including a via hole, the via hole extending into the substrate from a first surface thereof;
a through via in the via hole;
a semiconductor component on the first surface of the substrate;
an internal buffer structure surrounding the through via, the internal buffer structure being outside the via hole and being spaced apart from the via hole by a first distance; and
an external buffer structure surrounding the through via, the external buffer structure being spaced apart from the via hole by a second distance, the second distance being greater than the first distance, each of the first distance and the second distance being less than a distance between the through via and the semiconductor component.

12. The semiconductor device of claim 11, wherein both the internal buffer structure and the external buffer structure extend from the first surface of the substrate toward an inside of the substrate.

13. The semiconductor device of claim 11, wherein
the internal buffer structure includes a plurality of first segments, the first segments being spaced apart from each other, each of the first segments being spaced apart from a center of the through via by the first distance, and
the external buffer structure includes a plurality of second segments, the second segments being spaced apart from each other, the second segments being spaced apart from the center of the through via by the second distance.

14. The semiconductor device of claim 13, wherein when viewed in a plan view, each of the first segments of the internal buffer structure is not disposed on a straight line that connects the center of the through via to a center of each of the second segments of the external buffer structure.

15. The semiconductor device of claim 11, wherein when viewed in a plan view, the external buffer structure is a closed loop.

16. The semiconductor device of claim 11, wherein each of the internal buffer structure and the external buffer structure is a gap filled with air.

17. The semiconductor device of claim 11, wherein a top end of the internal buffer structure is at a level higher than a top end of the through via.

18. The semiconductor device of claim 11, wherein each of the internal buffer structure and the external buffer structure has a depth less than the through via such that each of the internal buffer structure and the external buffer structure does not fully penetrate the substrate.

19. The semiconductor device of claim 18, wherein
the substrate includes a well extending from the first surface, the well having the semiconductor component thereon, and
a bottom end of the internal buffer structure is at a same level as a bottom end of the well.

20. The semiconductor device of claim 11, further comprising:
an interlayer dielectric layer on the first surface of the substrate, the interlayer dielectric layer covering the semiconductor component,
wherein a top end of the through via is at a same level as the first surface of the substrate, and
wherein a top end of each of the internal buffer structure and the external buffer structure is at a same level as a top surface of the interlayer dielectric layer.

* * * * *